United States Patent
Cavins et al.

(10) Patent No.: US 10,607,879 B2
(45) Date of Patent: Mar. 31, 2020

(54) SUBSTRATE PROCESSING APPARATUS

(71) Applicant: BROOKS AUTOMATION, INC., Chelmsford, MA (US)

(72) Inventors: Jeffrey A. Cavins, Salem, NH (US); Leigh F. Sharrock, Londonberry, NH (US); Kyle M. Letourneau, Derry, NH (US); Stacey McKinney, Pepperell, MA (US); Dave Jarzynka, Sudbury, MA (US)

(73) Assignee: BROOKS AUTOMATION, INC., Chelmsford, MA (US)

( * ) Notice: Subject to any disclaimer, the term of this patent is extended or adjusted under 35 U.S.C. 154(b) by 39 days.

(21) Appl. No.: 15/693,871

(22) Filed: Sep. 1, 2017

(65) Prior Publication Data

US 2018/0068881 A1    Mar. 8, 2018

Related U.S. Application Data

(60) Provisional application No. 62/385,150, filed on Sep. 8, 2016.

(51) Int. Cl.
| | |
|---|---|
| *H01L 21/687* | (2006.01) |
| *H01L 21/67* | (2006.01) |
| *H01L 21/677* | (2006.01) |

(52) U.S. Cl.
CPC .. *H01L 21/68707* (2013.01); *H01L 21/67265* (2013.01); *H01L 21/67271* (2013.01);
(Continued)

(58) Field of Classification Search
CPC ................................................ H01L 21/68707
See application file for complete search history.

(56) References Cited

U.S. PATENT DOCUMENTS

| | | | |
|---|---|---|---|
| 5,022,695 A | 6/1991 | Ayers | |
| 6,572,320 B2 * | 6/2003 | Davis | H01L 21/67754 294/119.1 |

(Continued)

FOREIGN PATENT DOCUMENTS

WO    WO 03008157    1/2003

OTHER PUBLICATIONS

International Search Report, International Application No. PCT/US2017/050085, dated Dec. 7, 2017.

*Primary Examiner* — Thomas Randazzo
(74) *Attorney, Agent, or Firm* — Peman & Green, LLP; Colin C. Durham

(57) ABSTRACT

A substrate processing apparatus including a frame and at least one substrate transport arm having at least one end effector, each end effector having a base portion, a first and second substrate support tines mounted to and dependent from the base portion where at least one of the first and second substrate support tines is movable relative to the base portion, each of the first and second substrate support tines having respective substrate contacts configured to contact and support a substrate held by the end effector between the respective contacts of the first and second substrate support tines at a substrate support seat dimension span between the substrate contacts of the first and second substrate support tines, and an end effector drive section configured to vary a distance between the first and second substrate support tines relative to each other on the fly.

41 Claims, 30 Drawing Sheets

(52) U.S. Cl.
CPC .. *H01L 21/67276* (2013.01); *H01L 21/67727* (2013.01); *H01L 21/67766* (2013.01); *H01L 21/67778* (2013.01); *H01L 21/6875* (2013.01); *H01L 21/68742* (2013.01)

(56) References Cited

U.S. PATENT DOCUMENTS

| | | | | |
|---|---|---|---|---|
| 7,300,082 | B2 * | 11/2007 | Rogers | B25J 13/085 294/104 |
| 7,654,596 | B2 * | 2/2010 | Mantz | H01L 21/68707 294/103.1 |
| 8,628,288 | B2 * | 1/2014 | Duhamel | H01L 21/67276 414/217 |
| 8,800,774 | B2 | 8/2014 | Bonora | |
| 8,998,561 | B2 * | 4/2015 | Furuya | B25J 11/0095 414/744.8 |
| 2003/0035711 | A1 * | 2/2003 | Gilchrist | H01L 21/68707 414/744.5 |
| 2014/0356107 | A1 * | 12/2014 | Bonora | B65G 65/00 414/288 |
| 2016/0126128 | A1 * | 5/2016 | Bonora | H01L 21/68707 414/222.02 |
| 2016/0129586 | A1 * | 5/2016 | Moura | H01L 21/67265 700/228 |

* cited by examiner

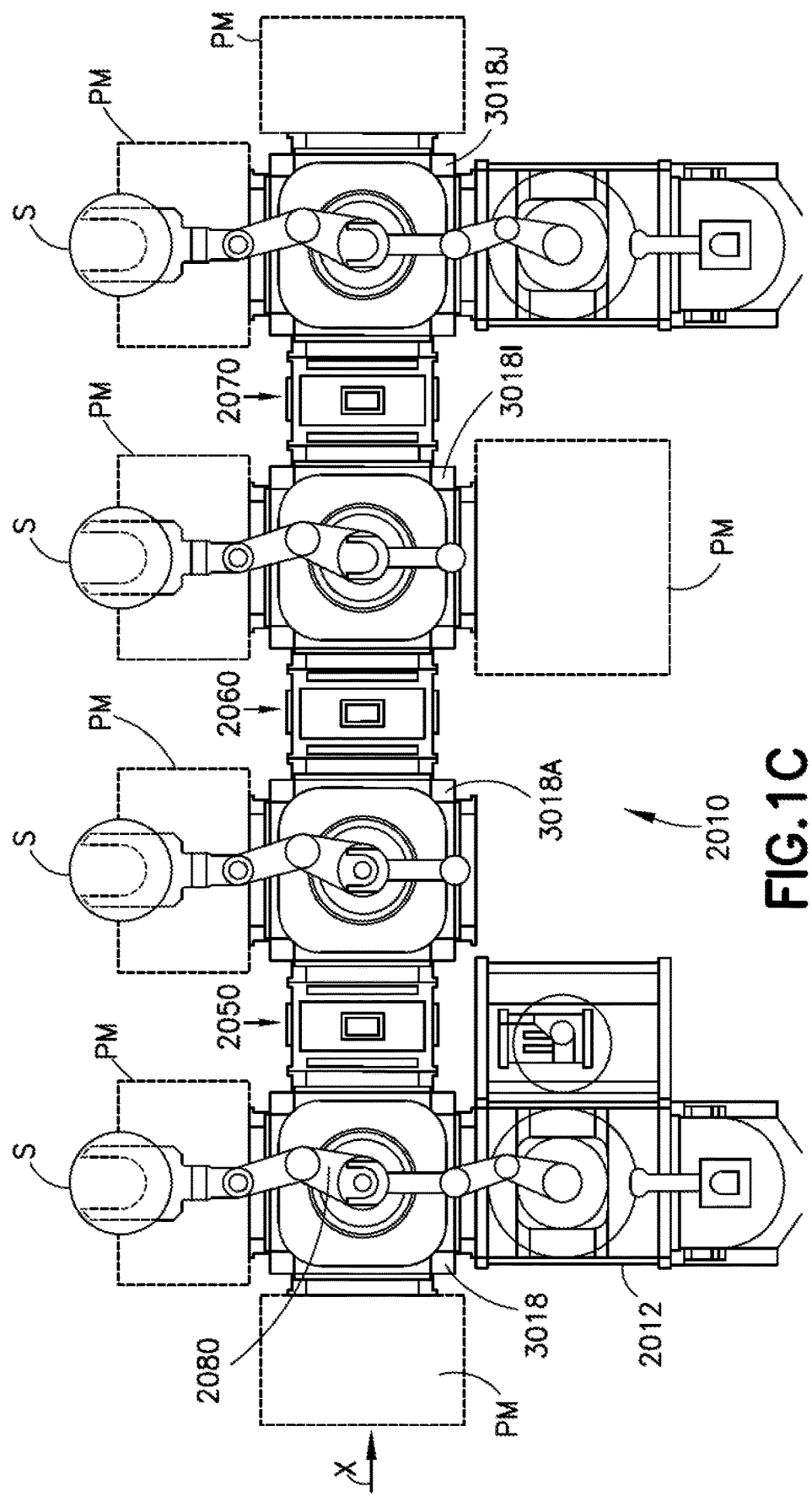

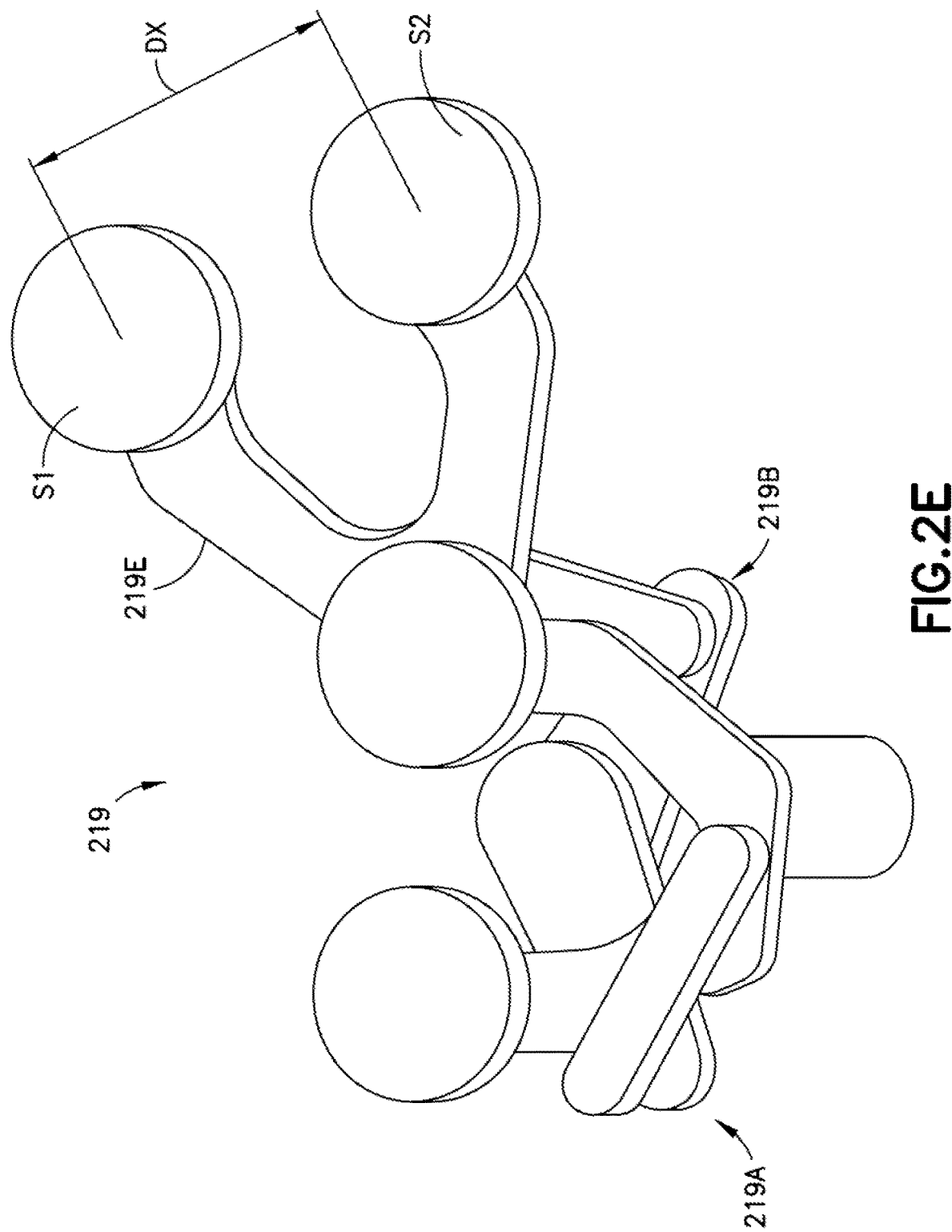

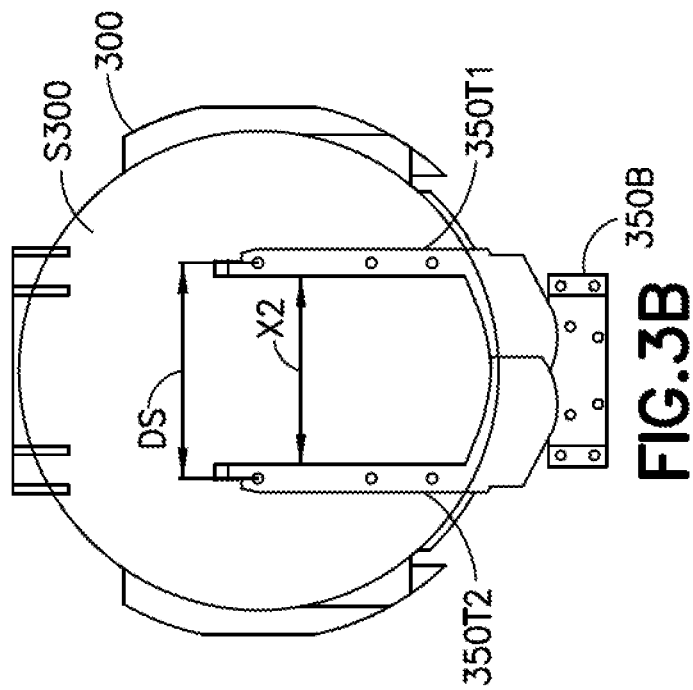
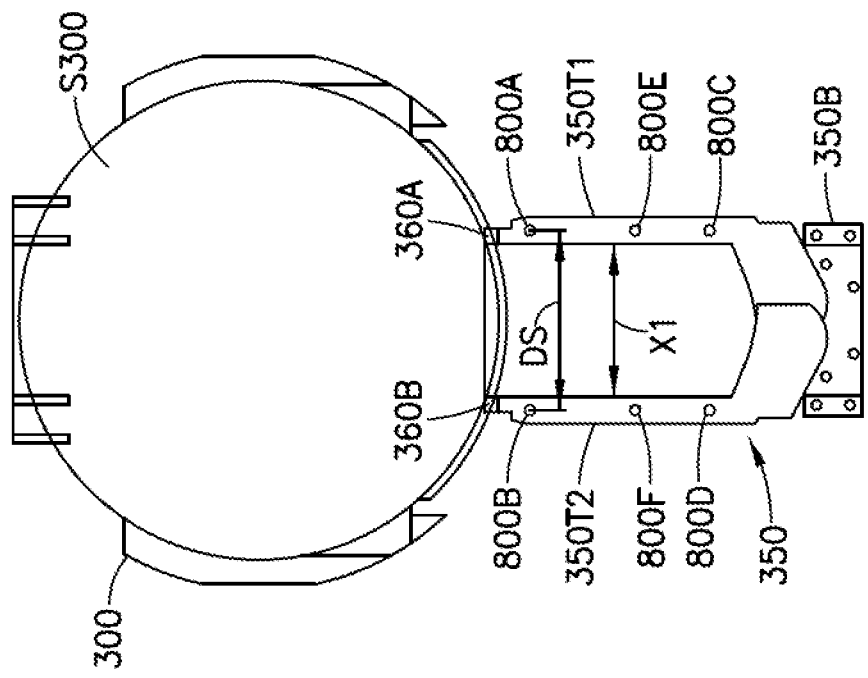

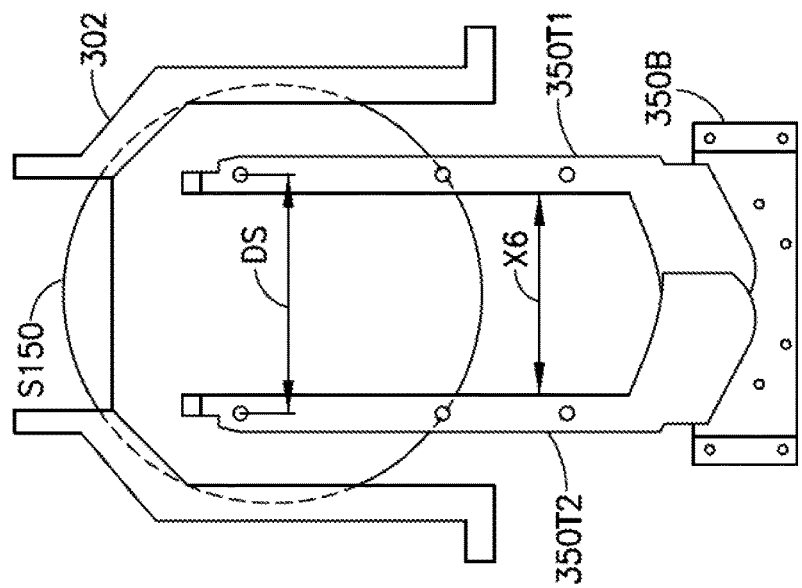
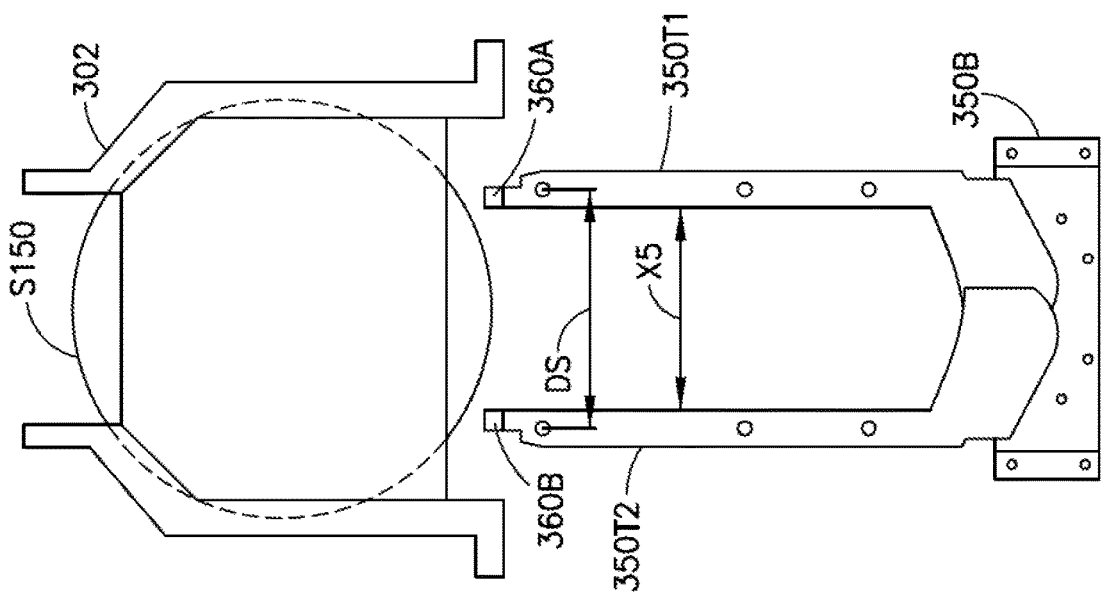

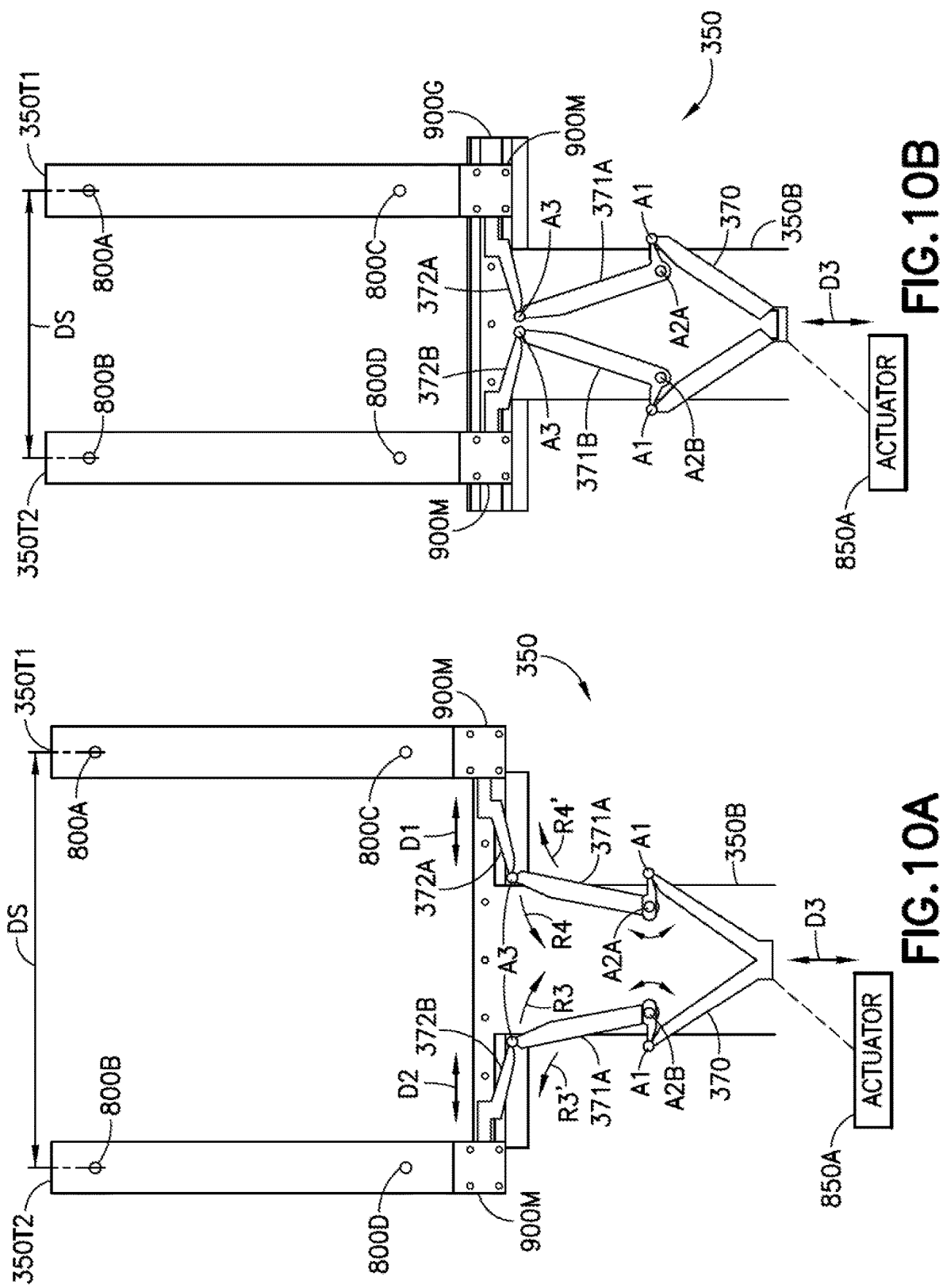

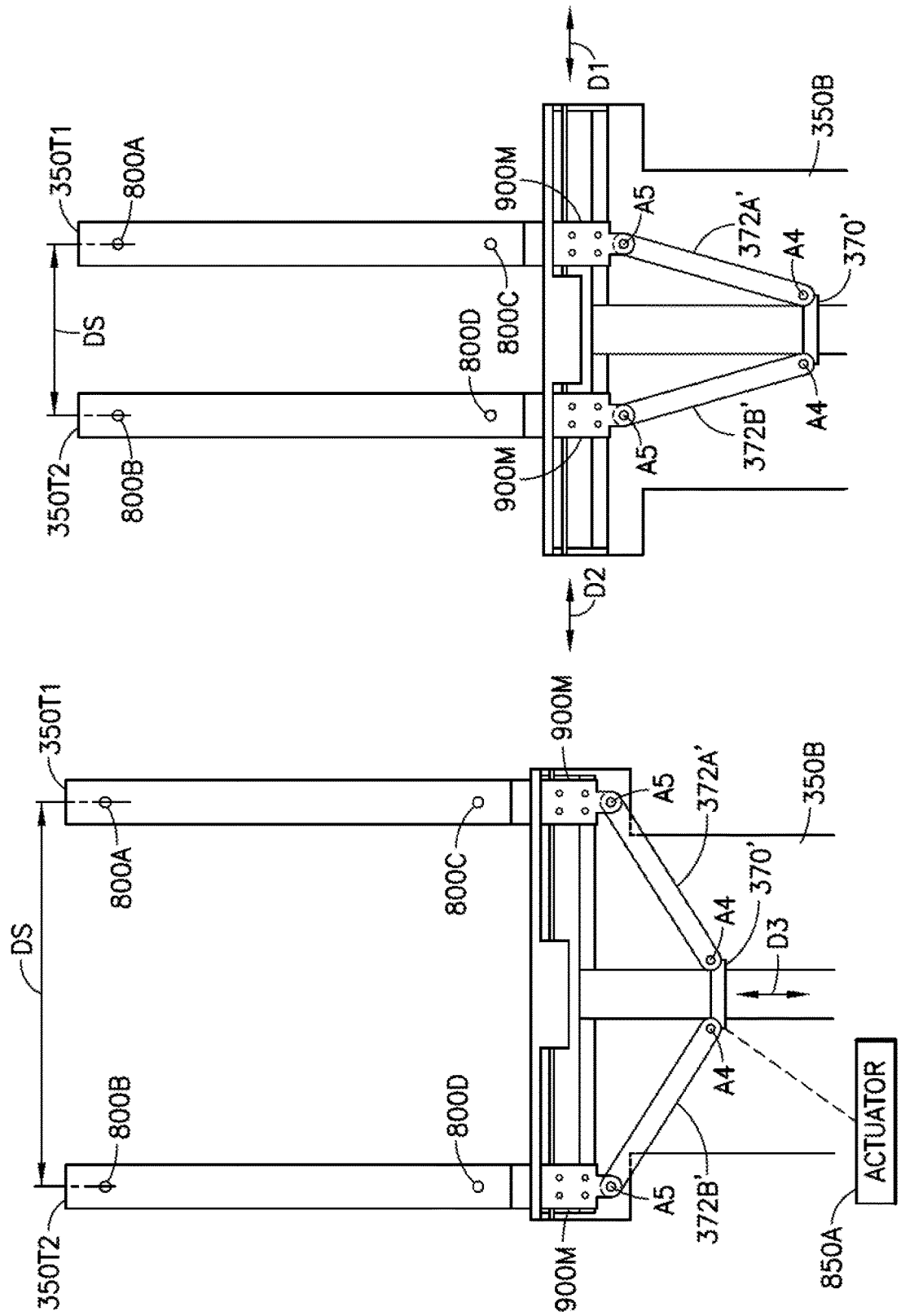

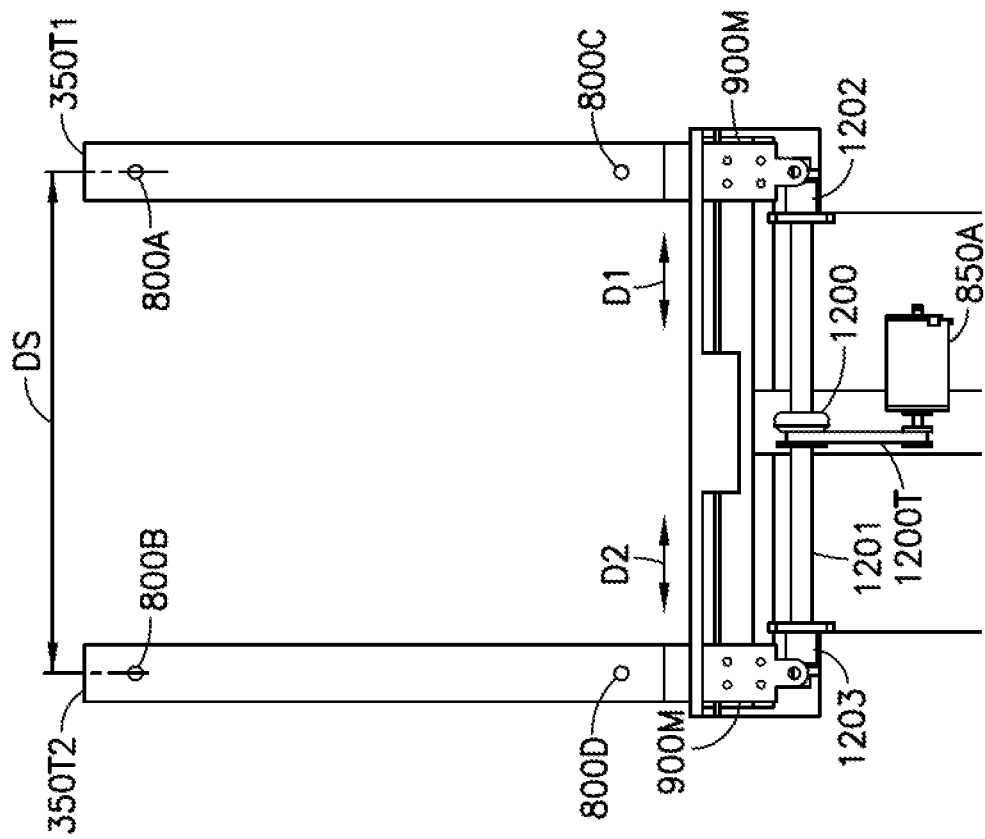
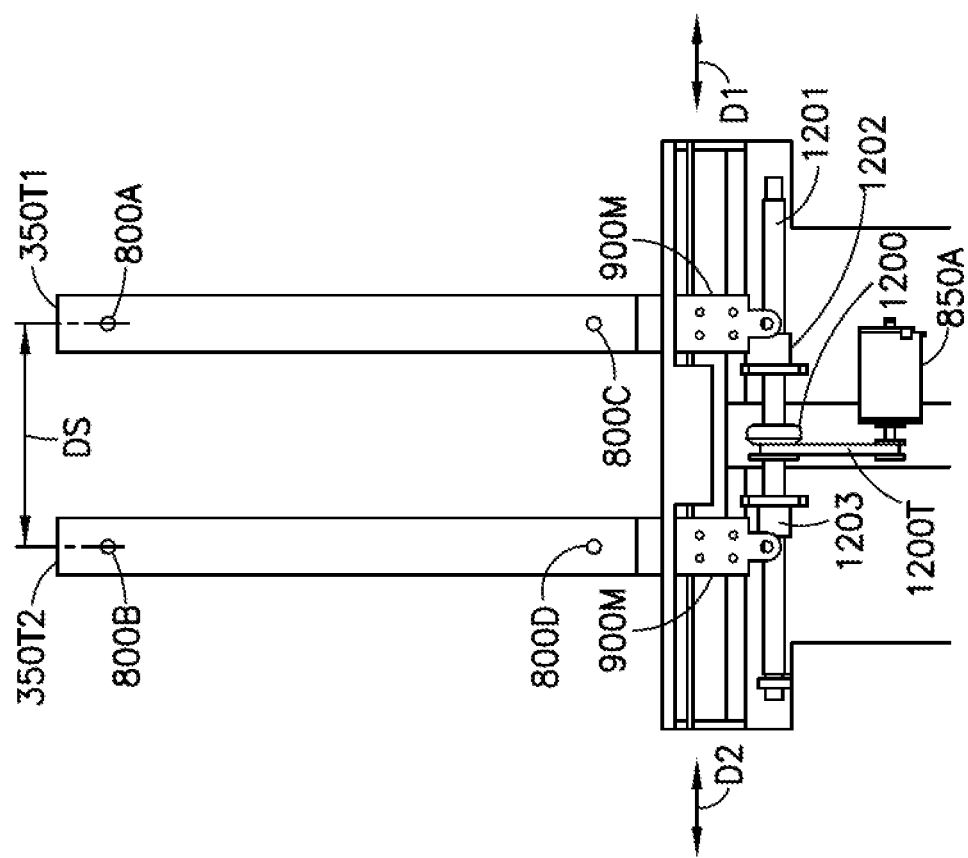
FIG. 12A
FIG. 12B

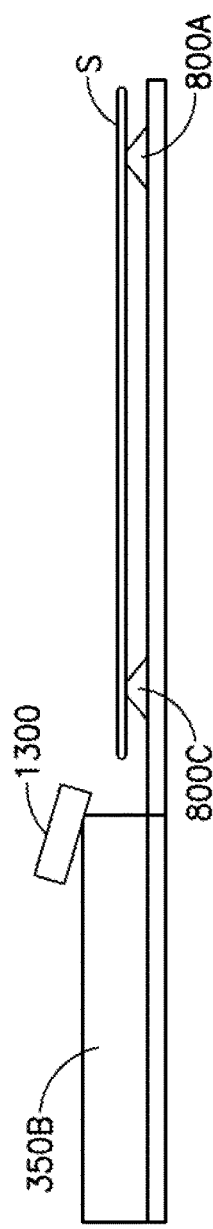
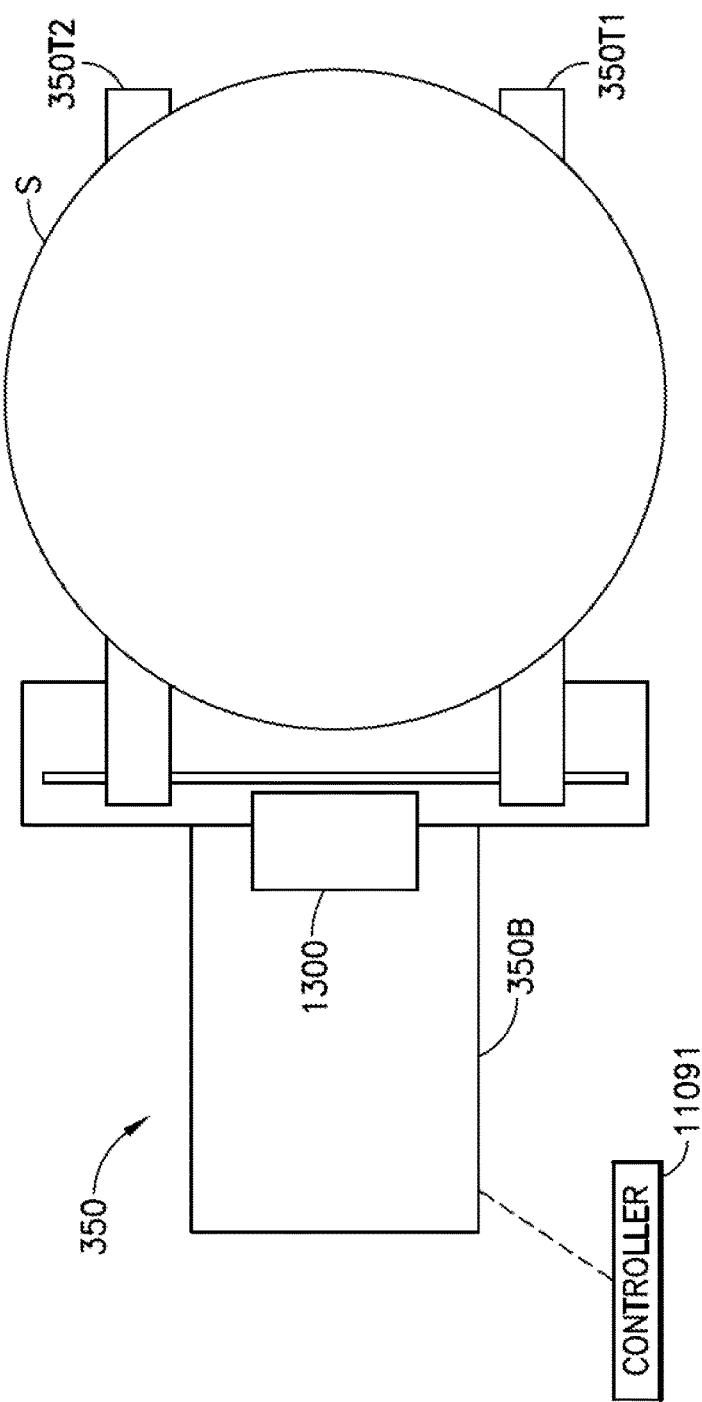

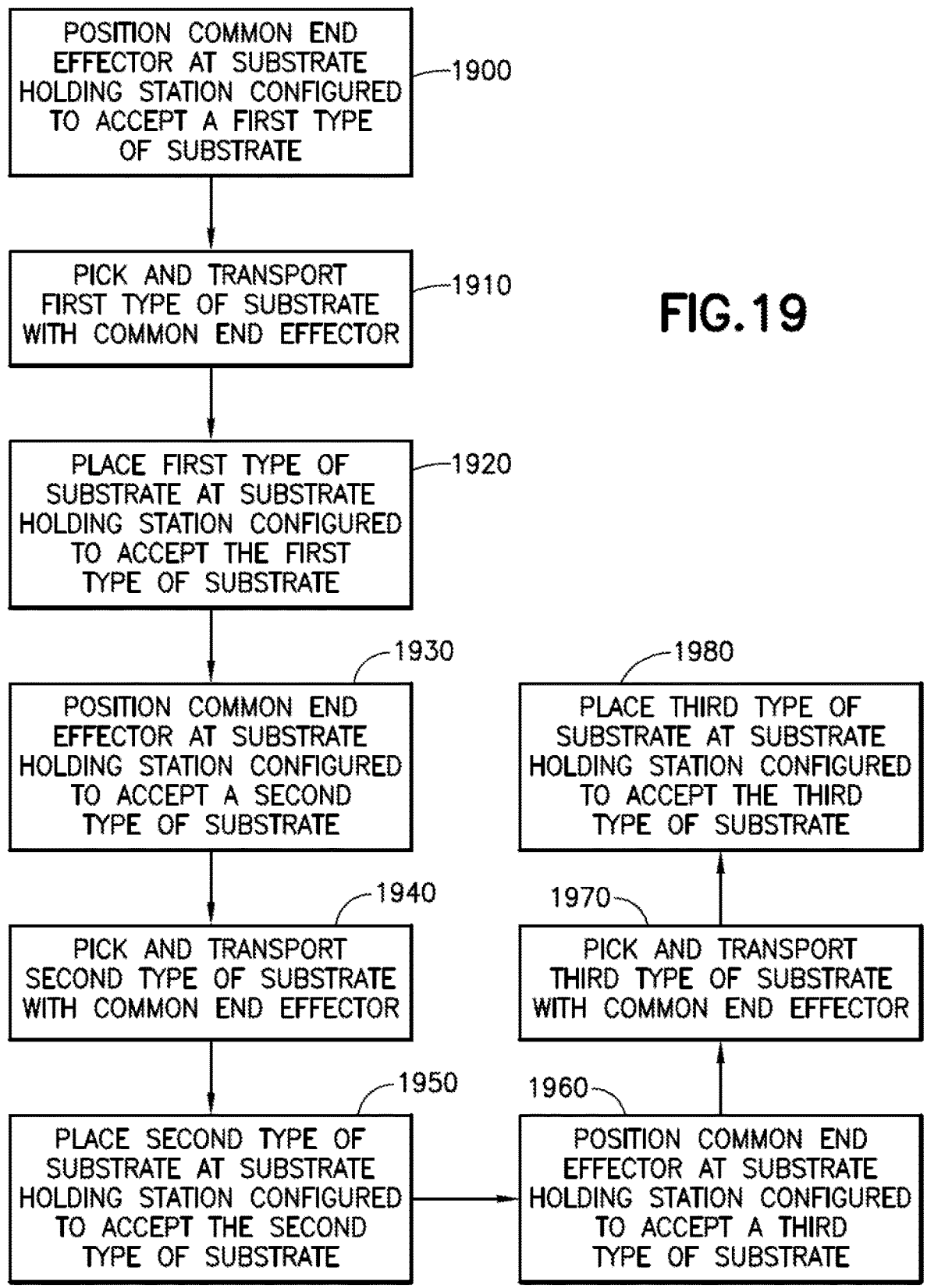

US 10,607,879 B2

SUBSTRATE PROCESSING APPARATUS

CROSS REFERENCE TO RELATED APPLICATIONS

This application is a non-provisional of and claims the benefit of U.S. Provisional Patent Application No. 62/385,150, filed on Sep. 8, 2016, the disclosure of which is incorporate by reference herein in its entirety.

BACKGROUND

1. Field

The exemplary embodiments generally relate to substrate processing apparatus, and more particularly, to handling of the substrates.

2. Brief Description of Related Developments

Handling substrates with one or more of a high degree of bow, warp and size variation poses a challenge to robotic substrate handling apparatus. Generally each of these three substrate conditions requires dedicated end effector geometry such that, for example, (1) an end effector for handling one size substrate may not be suitable for substrates of other sizes, and (2) an end effector for handling a non-bowed or non-warped may not be suitable for handling bowed or warped substrates.

Locations and positions of substrates within a substrate holding station also must be detected so that substrates may be transferred to and from the substrate holding station with the robotic substrate handling apparatus. Generally, a mapping device mounted on an end effector, such as on tines of the end effector, is used to map the locations and orientations of the substrates in the substrate holding station where, for example, the end effector moves a substrate scanning sensor past the substrates in the substrate holding station. In another instance, a stationary sensor may be used to scan the substrates in the substrate holding station for determining the substrate locations and orientations. However, an ideal location of the substrate scanning sensors, when mounted to the tines of the end effector, may not facilitate an ideal position of the tines for handling the substrates.

In addition, the mapping devices mounted to the end effector for mapping the substrates are generally required to be in close proximity to the substrates being mapped. The close proximity of the mapping devices to the substrates may be problematic when bowed and/or warped substrates are scanned or when multiple sized/shaped substrates are to be supported by the same end effector.

It would be advantageous to have an end effector solution that is configurable and re-configurable to handle multiple sized substrates, bowed substrates and/or warped substrates. It would also be advantageous to provide an end effector solution that is configurable and re-configurable to provide both ideal substrate mapping sensor positions and ideal substrate handling tine positions for the same or different sized substrates, bowed substrates and/or warped substrates.

BRIEF DESCRIPTION OF THE DRAWINGS

The foregoing aspects and other features of the disclosed embodiment are explained in the following description, taken in connection with the accompanying drawings, wherein:

FIGS. 1A-1H are schematic illustrations of a substrate processing apparatus incorporating aspects of the disclosed embodiment;

FIGS. 2A-2E are schematic illustrations of transport arms in accordance with aspects of the disclosed embodiment;

FIGS. 3A and 3B are schematic illustrations of a portion of a substrate transport apparatus in accordance with aspects of the disclosed embodiment;

FIGS. 5A and 5B are schematic illustrations of a portion of a substrate transport apparatus in accordance with aspects of the disclosed embodiment;

FIGS. 10A and 10B are schematic illustrations of a portion of a substrate transport apparatus in accordance with aspects of the disclosed embodiment;

FIGS. 11A and 11B are schematic illustrations of a portion of a substrate transport apparatus in accordance with aspects of the disclosed embodiment;

FIGS. 12A and 12B are schematic illustrations of a portion of a substrate transport apparatus in accordance with aspects of the disclosed embodiment;

FIGS. 13A-13C are schematic illustrations of a portion of a substrate transport apparatus in accordance with aspects of the disclosed embodiment;

FIG. 19 is a flow diagram in accordance with aspects of the disclosed embodiment.

DETAILED DESCRIPTION

Figure 1A:
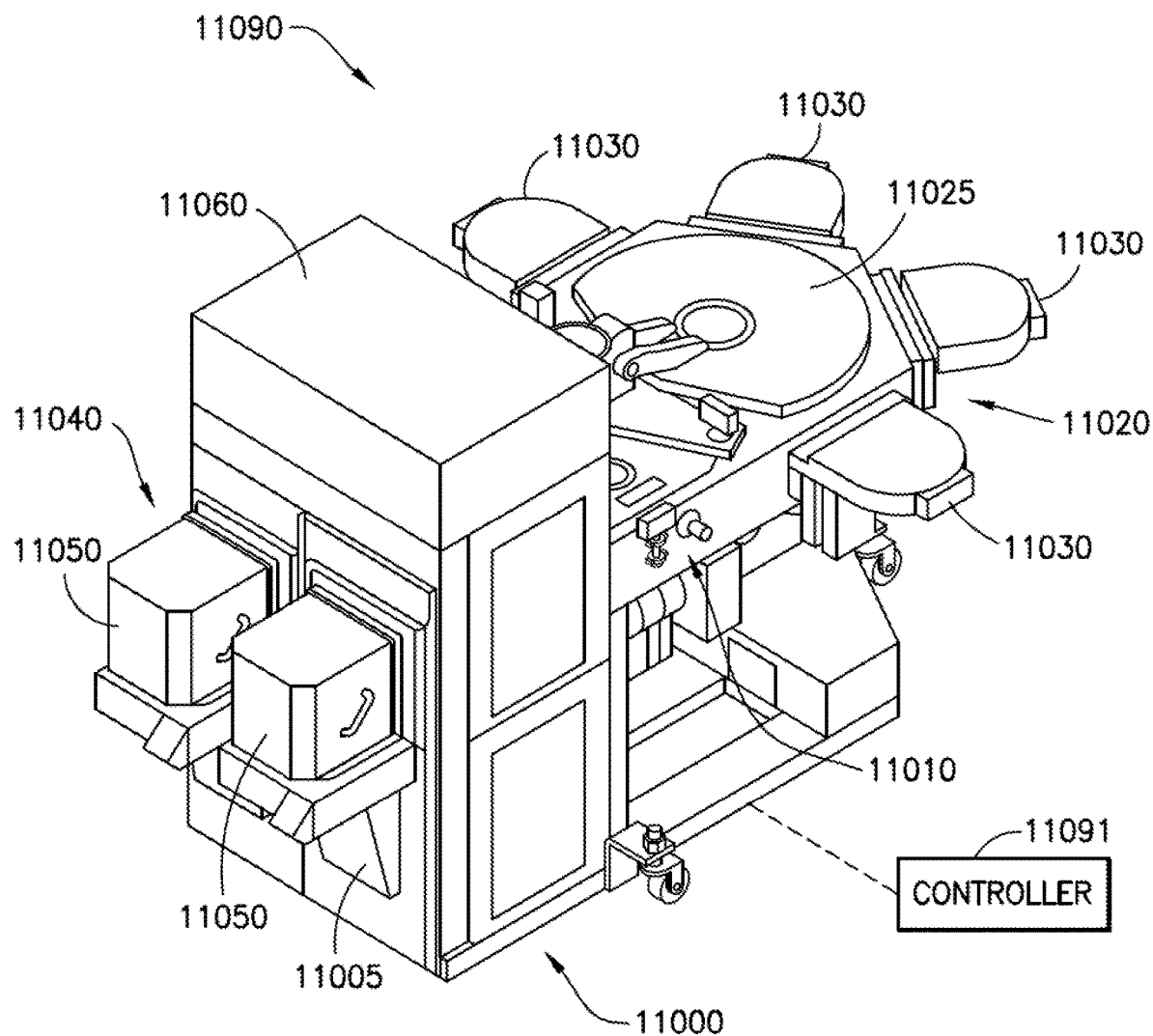

Referring to FIGS. 1A-1D, there are shown schematic views of substrate processing apparatus or tools incorporating the aspects of the disclosed embodiment as will be further described herein. Although the aspects of the disclosed embodiment will be described with reference to the drawings, it should be understood that the aspects of the disclosed embodiment can be embodied in many forms. In addition, any suitable size, shape or type of elements or materials could be used.

As will be described in greater detail below, the aspects of the disclosed embodiment provide a common end effector for the handling and mapping of any suitable workpiece(s) such as, for example, semiconductor substrates, separated semiconductor devices/chips, reticles, reticle carriers or any other suitable trays (e.g. such as Joint Electron Device Engineering Council (JEDEC) or JEDEC style trays or any other tray that holds one or more items such as separated semiconductor devices/chips), carriers and/or tools used in semiconductor manufacturing, all of which are collectively referred to herein as "substrates". The aspects of the disclosed embodiment also provide for handling and mapping of bowed substrates, warped substrates and/or substrates having varying sizes (e.g. 100 mm, 150 mm, 200 mm, 300 mm, 450 mm, etc. substrates) with a common end effector (e.g. a single end effector solution) as will be described in greater detail below. The aspects of the disclosed embodiment provide for handling of the substrate at contact locations that are determined for each substrate depending on for example, one or more of, substrate bow, substrate warpage and a size of the substrate. It is noted that, as used herein the term bow with respect to the substrates is the deviation of the center point of the median surface of a free, undamped substrate from the median surface to a reference plane defined by three corners of an equilateral triangle. The term warp with respect to the substrates is the difference between the maximum and minimum distances of the median surface of a free, undamped substrate from the reference plane. In one aspect, varying the end effector/substrate contact locations (e.g. the substrate support seat dimension span between the substrate contacts) allows for transport of substrates with a common end effector under circumstances where the substrate type, size and/or shape is constantly changing (e.g. substrates having different predetermined physical characteristics such as bow, warp and, size).

In one aspect, an imaging device provides a common sensor for imaging one or more substrates on the end effector and/or located at a substrate holding station or other suitable locations remote from the end effector. In one aspect, the common sensor provides for detecting both the presence of a substrate(s) on the end effector and mapping substrates in locations remote from the end effector (such as in substrate holding stations). As described herein, in one aspect of the disclosed embodiment, a suitable sensor, such as a camera or other imaging device, is disposed on the substrate transport apparatus. The camera effects training a controller of the substrate transport apparatus to sense substrates of different shapes, different flatness and different sizes (e.g. by providing substrate mapping data to facilitate varying the substrate support seat dimension span between the substrate contacts of a transport apparatus end effector from substrate to substrate as described herein). In one aspect, the trained controller, may effect repositioning the end effector substrate contact locations (e.g. the substrate support seat dimension span between the substrate contacts) for handling the substrates having one or more of a bowed condition, a warped condition and different sizes with a common end effector of the substrate transport apparatus.

It is noted that the terms substrate and wafer are used interchangeably herein. Also, as used herein the term substrate holding station is a substrate holding location within a process module or any other suitable substrate holding location within the substrate processing apparatus such as, for example, a load port (or substrate cassette held thereon), a load lock, a buffer station, etc. It is also noted that the phrase mapping substrates refers to determining a location, orientation and/or a physical condition (e.g. bow, warp, etc.) of each substrate at a substrate holding station to effect end effector positioning relative to the substrate holding station for picking/placing substrates to the substrate holding station.

Figure 1B:
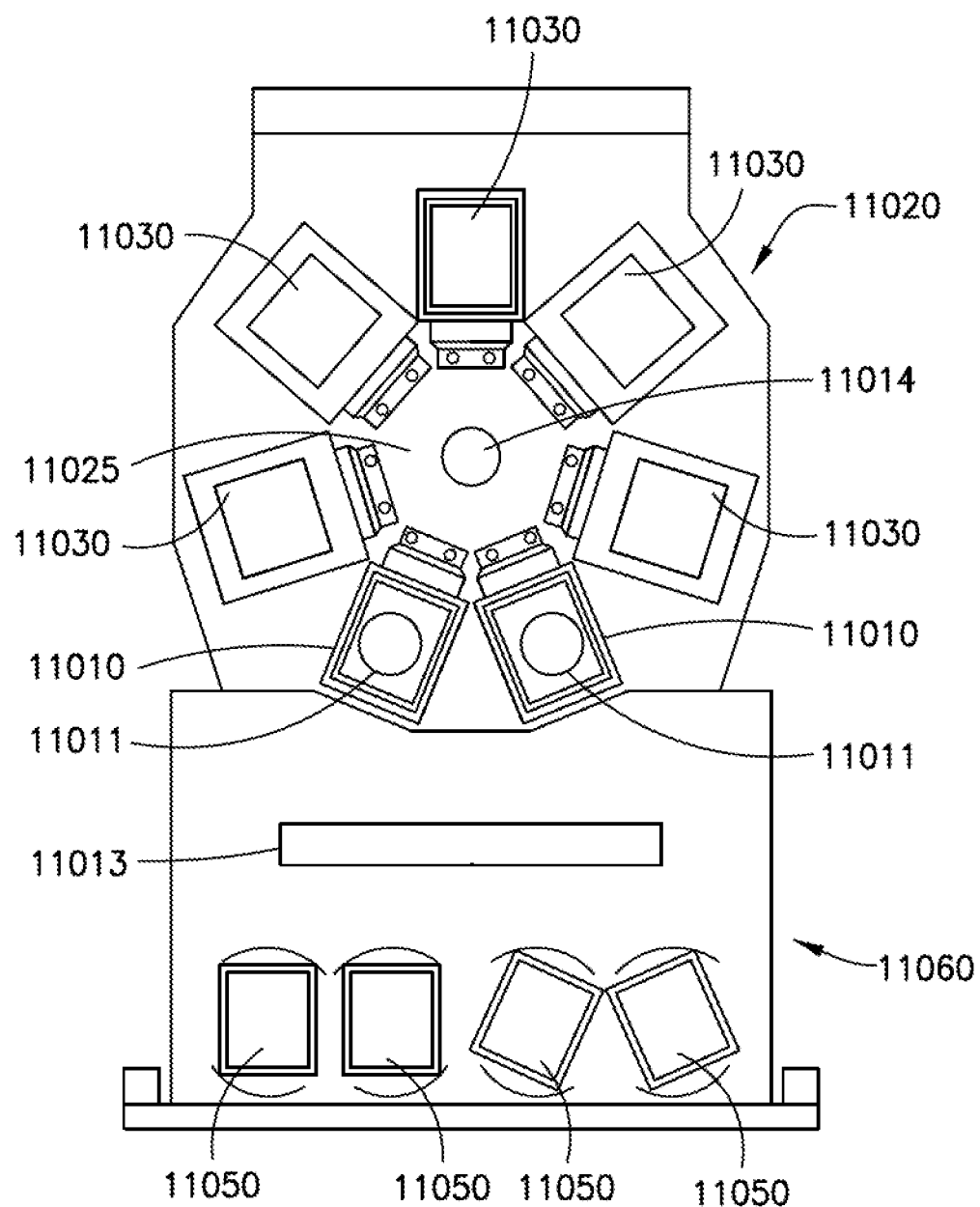

Referring to FIGS. 1A and 1B, a processing apparatus, such as for example a semiconductor tool station or processing apparatus 11090 is shown in accordance with aspects of the disclosed embodiment. Although a semiconductor tool 11090 is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized. The controller 11091 includes any suitable memory and processor(s) that include non-transitory program code for operating the processing apparatus described herein to effect handling and mapping of the bowed substrates, warped substrates and/or substrates having varying sizes as described herein. For example, in one aspect, the controller 11091 includes embedded substrate locating commands. In one aspect, the substrate locating commands may be embedded pick/place commands for determining a distance between the substrate and end effector of the substrate transport apparatus as described herein. In one aspect the substrate locating commands may be embedded pick/place commands that move the end effector to a predetermined position to obtain substrate mapping data for determining a location and/or condition of one or more substrates at a substrate holding station. The controller is configured to determine the location of the substrate relative to the end effector and/or the substrate holding station to effect, picking and placing of the bowed substrates, warped substrates and/or substrates having varying sizes. In one aspect, the controller is configured to receive detection signals corresponding to one or more features of the end effector and/or transport arm of a substrate transport apparatus/robot and determine the location of the substrate relative to the end effector and/or the substrate holding station to effect picking and placing of the bowed substrates, warped substrates and/or substrates having varying sizes and/or a position of one or more end effector tines as will be described herein.

In one aspect, the front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E4 7.1, E62, E19.5 or E1.9 for 300 mm load ports, front opening or bottom opening boxes/pods and cassettes. In other aspects, the load port modules may be configured as 200 mm wafer or 450 mm wafer interfaces or any other suitable substrate interfaces such as for example larger or smaller wafers or flat panels for flat panel displays. Although two load port modules 11005 are shown in FIG.

1A, in other aspects any suitable number of load port modules may be incorporated into the front end 11000. The load port modules 11005 may be configured to receive substrate carriers or cassettes 11050 from an overhead transport system, automatic guided vehicles, person guided vehicles, rail guided vehicles or from any other suitable transport method. The load port, modules 11005 may interface with the mini-environment 11060 through load ports 11040. In one aspect the load ports 11040 allow the passage of substrates between the substrate cassettes 11050 and the mini-environment 11060.

In one aspect, the mini-environment 11060 generally includes any suitable transfer robot 11013 that incorporates one or more aspects of the disclosed embodiment described herein. In one aspect the robot 11013 may be a track mounted robot such as that described in, for example, U.S. Pat. No. 6,002,840, the disclosure of which is incorporated by reference herein in its entirety or in other aspects, any other suitable transport robot having any suitable configuration. The mini-environment 11060 may provide a controlled, clean zone for substrate transfer between multiple load port modules.

The vacuum load lock 11010 may be located between and connected to the mini-environment 11060 and the back end 11020. It is noted that the term vacuum as used herein may denote a high vacuum such as $10^{-5}$ Torr or below in which the substrates are processed. The load lock 11010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. In one aspect, the load lock 11010 includes an aligner 11011 for aligning a fiducial of the substrate to a desired position for processing. In other aspects, the vacuum load lock may be located in any suitable location of the processing apparatus and have any suitable configuration and/or metrology equipment.

The vacuum back end 11020 generally includes a transport chamber 11025, one or more processing station(s) or module(s) 11030 and any suitable transfer robot or apparatus 11014. The transfer robot 11014 will be described below and may be located within the transport chamber 11025 to transport substrates between the load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa. In one aspect the load port modules 11005 and load ports 11040 are substantially directly coupled to the vacuum back end 11020 so that a cassette 11050 mounted on the load port interfaces substantially directly (e.g. in one aspect at least the mini-environment 11060 is omitted while in other aspects the vacuum load lock 11010 is also omitted such that the cassette 11050 is pumped down to vacuum in a manner similar to that of the vacuum load lock 11010) with a vacuum environment of the transfer chamber 11025 and/or a processing vacuum of a processing station 11030 (e.g. the processing vacuum and/or vacuum environment extends between and is common between the processing station 11030 and the cassette 11050).

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM (which in one aspect, are substantially similar to processing stations 11030 described above). As may be realized, each chamber module may be capable of holding an isolated or controlled atmosphere (e.g. N2, clean air, vacuum).

Figure 1D:
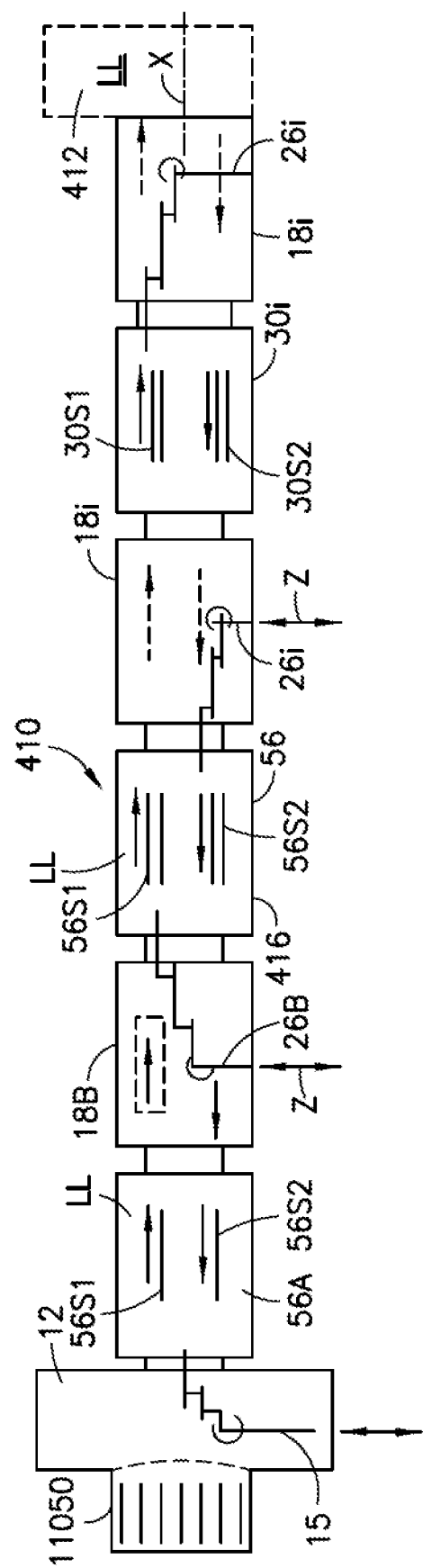

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit, stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56 and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

Figure 2A:
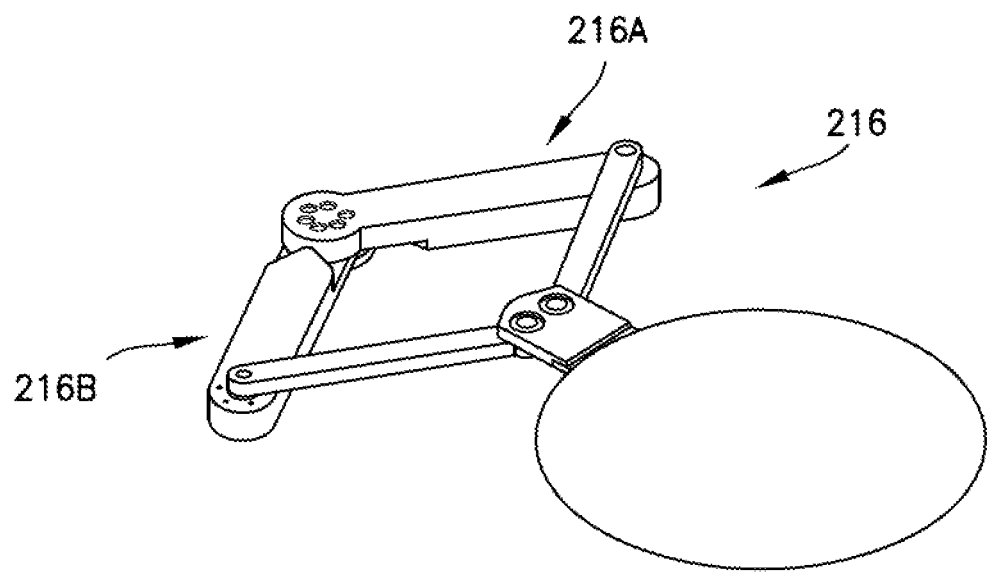
Figure 2B:
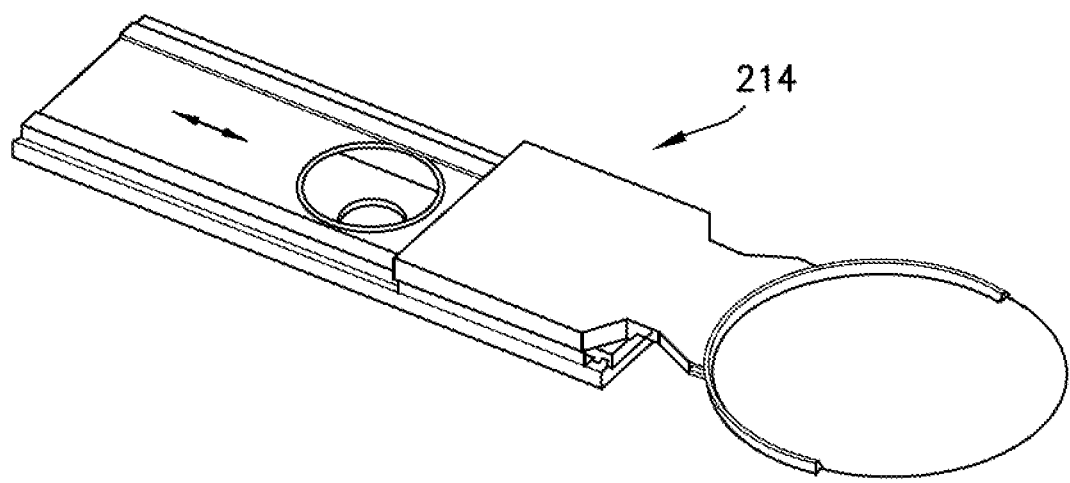
Figure 2C:
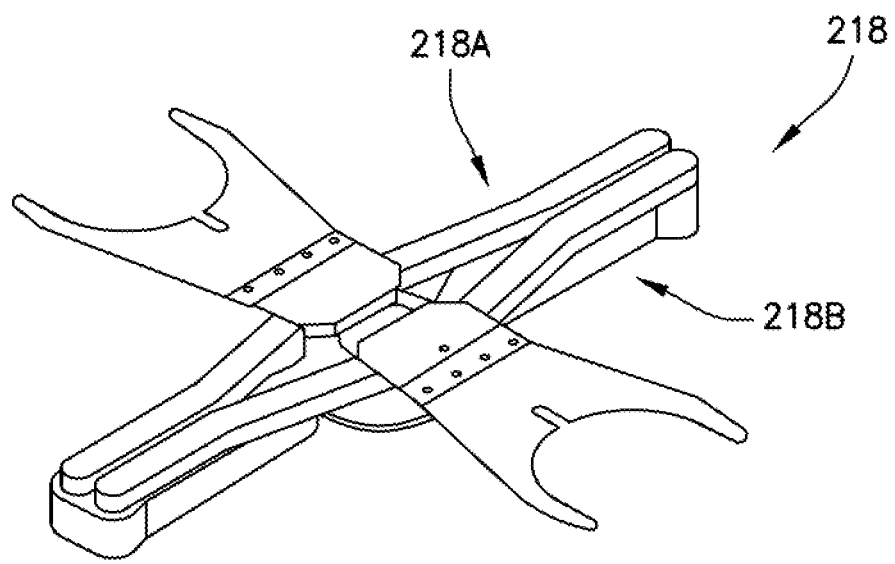
Figure 2D:
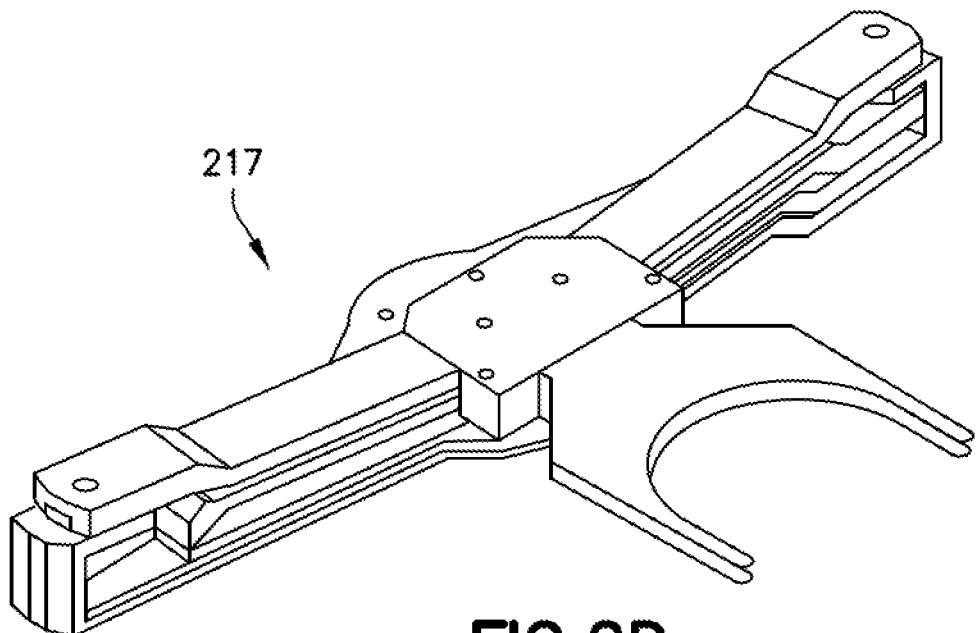

As also noted before, transport chamber modules 18B, 18i have one or more corresponding transport apparatus 26B, 26i, which may include one or more aspects of the disclosed embodiment, described herein, located therein. The transport apparatus 26B, 26i of the respective transport chamber modules 18B, 18i may cooperate to provide the linearly distributed workpiece transport system in the transport chamber. In this aspect, the transport apparatus 26B (which may be substantially similar to the transport apparatus 11013, 11014 of the cluster tool illustrated in FIGS. 1A and 1B) may have a general SCARA arm configuration (though in other aspects the transport arms may have any other desired arrangement such as, for example, a linearly sliding arm 214 as shown in FIG. 2B or other suitable arms having any suitable arm linkage mechanisms. Suitable examples of arm linkage mechanisms can be found in, for example, U.S. Pat. No. 7,578,649 issued Aug. 25, 2009,U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/253,717 entitled "Dual Arm Robot" and filed on Nov. 10, 2011 and U.S. patent application Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm may be derived from a conventional SCARA (selective compliant articulated robot arm) type design, which includes an upper arm, a band-driven forearm and a band-constrained end-effector, or from a telescoping arm or any other suitable arm design. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement, such as a frog-leg arm 216 (FIG. 2A) configuration, a leap frog arm 217 (FIG. 2D) configuration, a bi-symmetric arm 218 (FIG. 2C) configuration, etc. In another aspect, referring to FIG. 2E, the transfer arm 219 includes at least a first and second articulated arm 219A, 219B where each arm 219A, 219B includes an end effector 219E configured to hold at least two substrates S1, S2 side by side in a common transfer plane (each substrate holding location of the end effector 219E shares a common drive for picking and placing the substrates S1, S2) where the spacing DX between the substrates S1, S2 corresponds to a fixed spacing between side by side substrate holding locations. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578, 649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/253,717 entitled "Dual Arm Robot" and filed on Nov. 10, 2011 and U.S. patent application Ser. No. 13/270,844 entitled "Coaxial Drive Vacuum Robot" and filed on Oct. 11, 2011 the disclosures of which are all incorporated by reference herein in their entireties. The aspects of the disclosed embodiment are, in one aspect, incorporated into the transport arm of a linear transport shuttle such as those described in, for example, U.S. Pat. Nos. 8,293,066 and 7,988,398 the disclosures of which are incorporated herein by reference in their entireties.

In the aspect of the disclosed embodiment shown in FIG. 1D, the arms of the transport apparatus 26B may be arranged to provide what may be referred to as fast swap arrangement allowing the transport to quickly swap wafers (e.g. pick a wafer from a substrate holding location and then immediately place a wafer to the same substrate holding location) from a pick/place location. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about, shoulder and elbow joints with Z axis motion). As seen in FIG. 1D, in this aspect the modules 56A, 56, 30*i* may be located interstitially between transfer chamber modules 18B, 18*i* and may define suitable processing modules, load lock(s) LL, buffer station(s), metrology station(s) or any other desired station (s). For example the interstitial modules, such as load locks 56A, 56 and workpiece station 30*i*, may each have stationary workpiece supports/shelves 56S1, 56S2, 30S1, 30S2 that may cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30*i* with arm 26*i* (in module 18*i*) and between station 30*i* and station 412 with arm 26*i* in module 18*i*. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18*i*. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 1E:
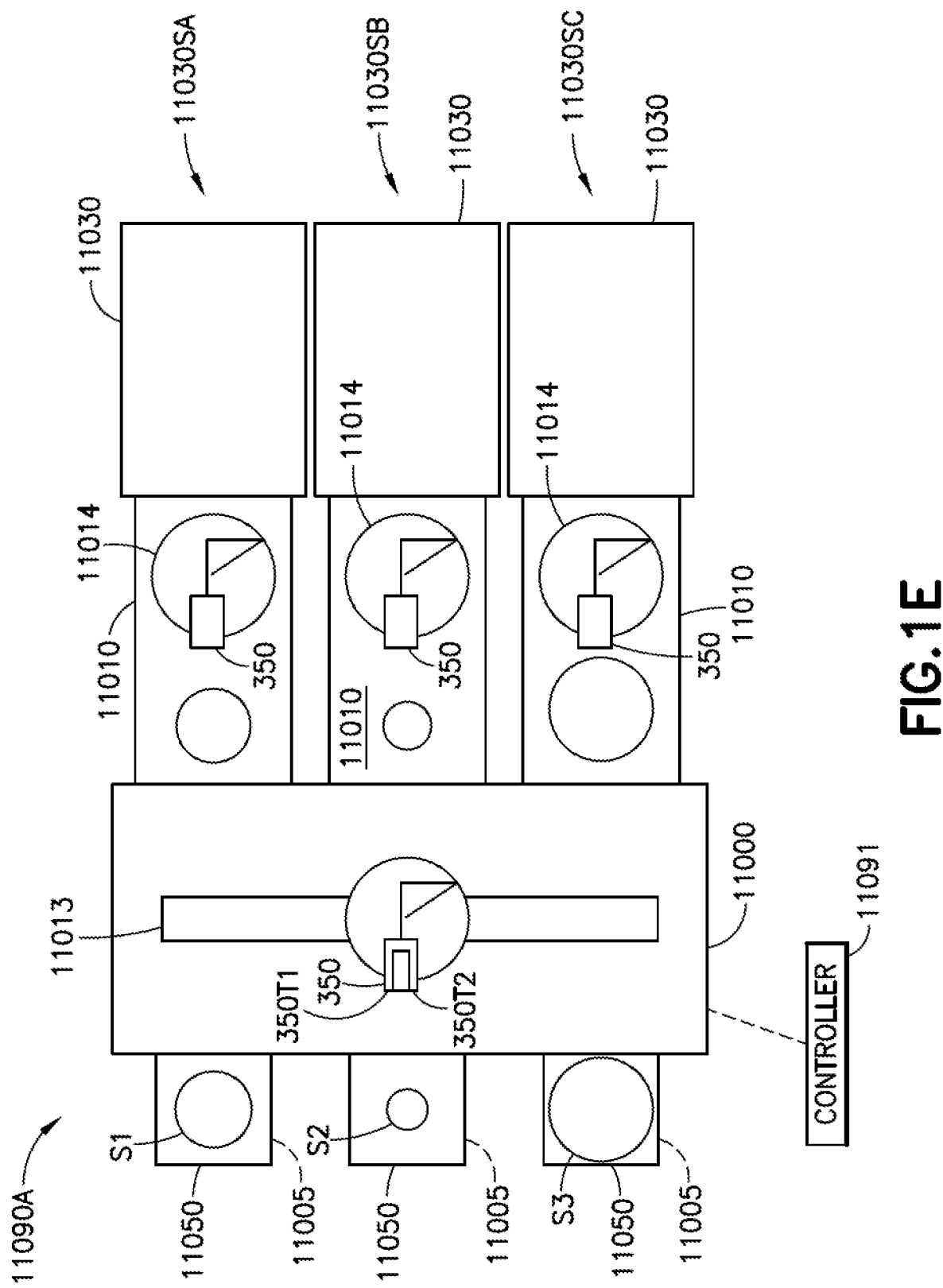

FIG. 1E is a schematic illustration of a semiconductor tool station 11090A which may be substantially similar to the semiconductor tool stations described above. Here, the semiconductor tool station 11090A includes separate/distinct in-line processing sections 11030SA, 11030SB, 11030SC connected to a common atmospheric front end 11000. In this aspect, at least one of the in-line processing sections 11030SA, 11030SB, 11030SC is configured to process a substrate S1, S2, S3 that has a different predetermined characteristic than the substrates processed in the other in-line processing sections 11030SA, 11030SB, 11030SC. For example, the predetermined characteristic may be a size of the substrate. In one aspect, for exemplary purposes only, in-line processing section 11030SA may be configured to process 200 mm diameter substrates, in-line processing section 11030SB may be configured to process 150 mm substrates, and in-line processing section 11030SC may be configured to process 300 mm substrates. As described herein, at least one of the transport apparatus 11013, 11014 is configured to transport the different sized substrates S1, S2, S3, which may be bowed or warped, with a common end effector. In one aspect, each of the load port modules 11050 may be configured to hold and interface with, on a common load port module, cassettes 11050 which hold different size substrates S1, S2, S3. In other aspects, each load port module 11050 may be configured to hold a predetermined cassette corresponding to a predetermined sized substrate. Processing substrates of different sizes with at least one common transport apparatus 11013, 11014 may increase throughput and decrease machine down time with respect to single substrate batch processing.

Figure 1F:
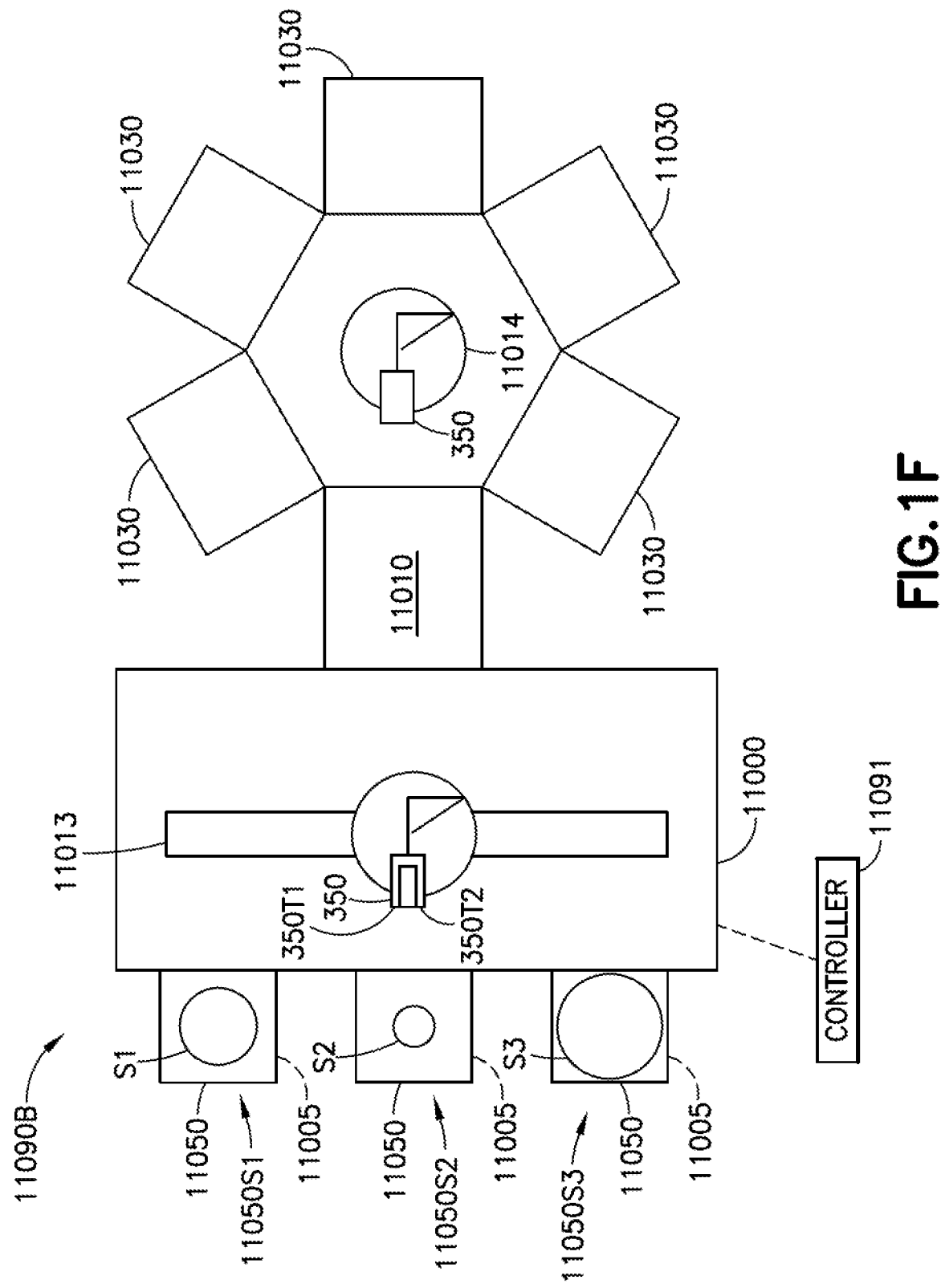

FIG. 1F is a schematic illustration of a semiconductor tool station 11090B substantially similar to semiconductor tool station 11090. However, in this aspect, the process modules 11030 and load port modules 11005 are configured to process substrates having different sizes as described above with respect to semiconductor tool station 11090A. In this aspect, the process modules 11030 may be configured to process substrates having different sizes or in other aspects, process modules may be provided that correspond to the different size substrates being processed in the semiconductor tool station 11090B.

Figure 1G:
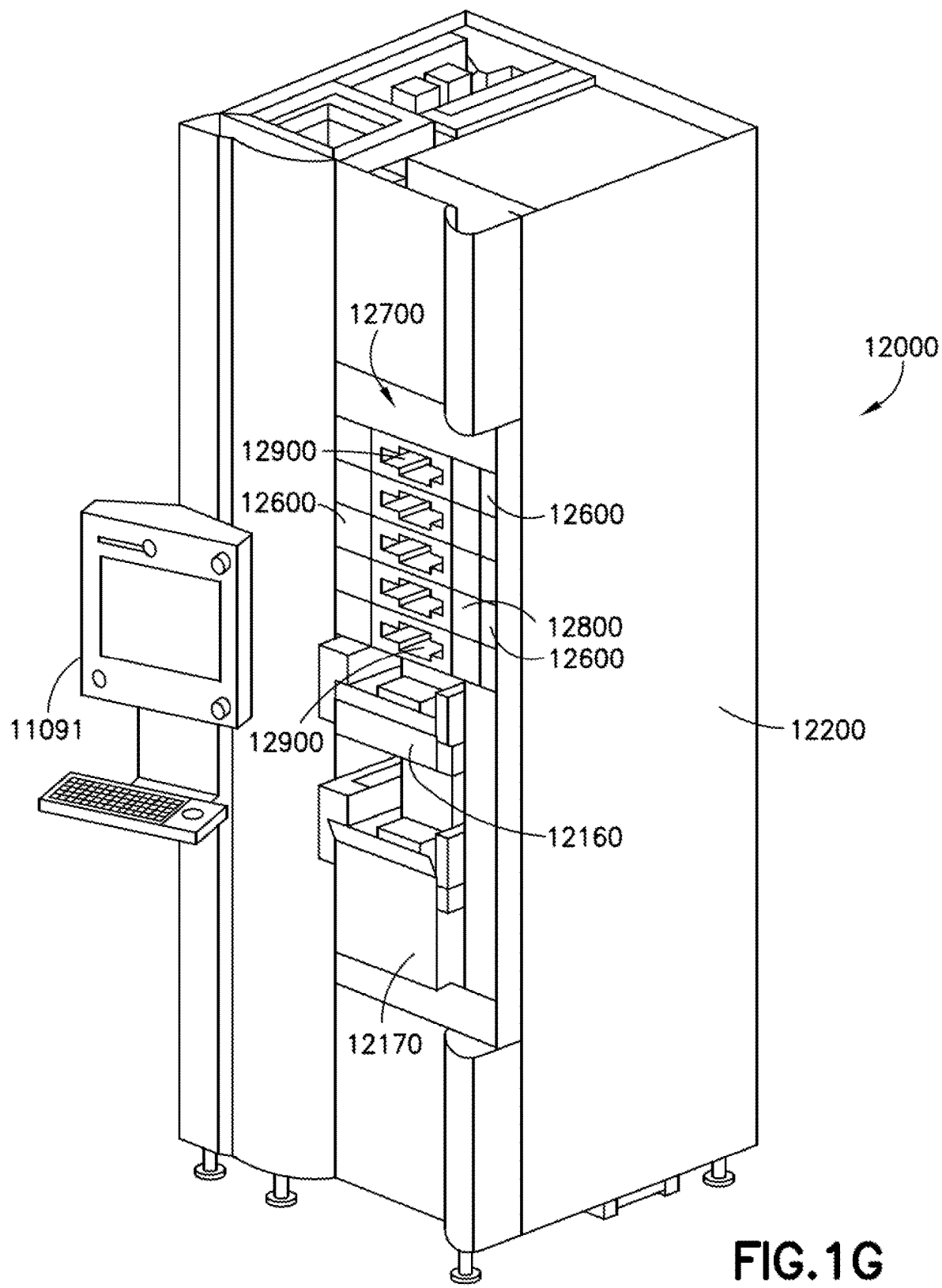
Figure 1H:
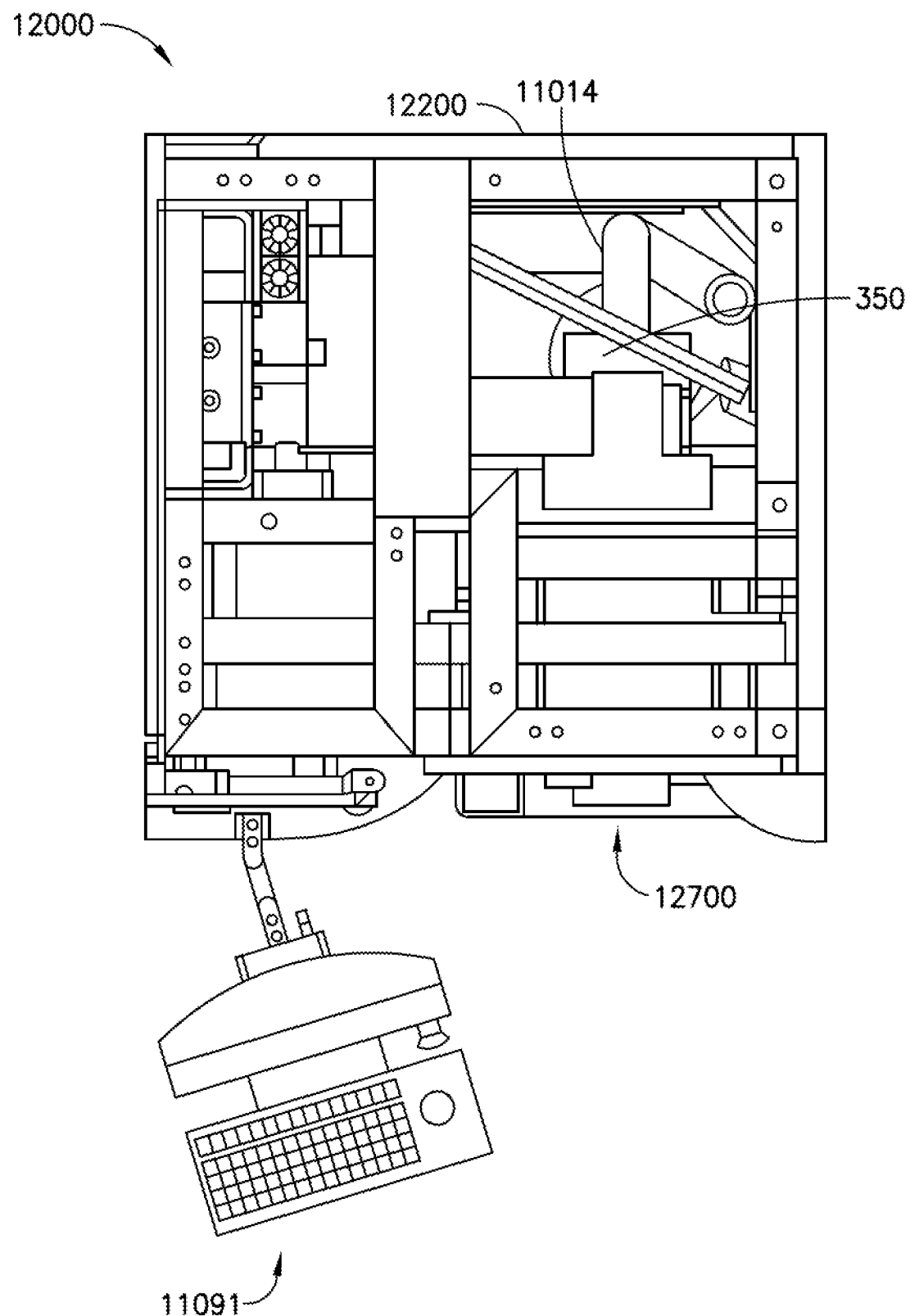

Referring to FIGS. 1G and 1H, the aspects of the disclosed embodiment may be incorporated into sorting machines and/or stockers. In one aspect, the sorting machines and/or stockers may be used to sort or stock substrates (such as those described above). As an example, FIGS. 1G and 1H illustrate a manipulating device 12000 substantially similar to that described in U.S. Pat. No. 7,699,573 issued on Apr. 20, 2010, the disclosure of which is incorporated herein by reference in its entirety. Here the manipulating device 12000 may be configured to manipulate substrates such as reticles but in other aspects the manipulating device 12000 may be configured to manipulate any suitable substrate. The manipulating device 12000 may be a modular device having a housing 12200 for maintaining clean a room environment within the housing 12200. The manipulating device 12000 includes an input/output station 12700 integrated into the housing 12200 that includes panels 12600. Each panel 12600 belongs to an input/output unit 12800 which is also modular. One edge of an opening 12900 of the respective panel 12600 is provided with a contour that corresponds at least approximately to the outer contour of each type of substrate (such as e.g. a reticle transport box) that is to be processed by the manipulating device 12000. The openings 12900 are configured so that the substrates can be input/output through the openings 12900 to and from the manipulating device 12000. In one aspect, the manipulating device 12000 also includes drawers 12170, 12160 that are components of additional input/output units 12800 of station 12700. The drawers 12170, 12160 may have different structural height, and can be pulled out to accept larger transport boxes, for example, those which can accommodate more than one substrate, i.e. the larger transport boxes can be introduced into the manipulating device 12000 through the drawers 12160, 12170. The manipulating device 12000 also includes at least one transport apparatus 11014 substantially similar to those described herein. The at least one transport apparatus is configured to transport the one or more substrates within the manipulating device 12000 for sorting, stocking or for any other processing operation(s). It is noted that the configuration of the manipulating device 12000 described herein is exemplary and in other aspects, the manipulating device may have any suitable configuration for sorting and/or stocking substrates in any suitable manner.

In one aspect, the manipulating device 12000 may be included in the semiconductor tool stations of FIGS. 1A-1F described above. For example, in one aspect, the manipulating device 12000 may be incorporated in the atmospheric front end 11000 of the semiconductor tool stations/systems 11090, 2010, 11090A, 11090B as a load port and/or atmospheric transfer chamber; while in other aspects the manipulating device may be incorporated in the vacuum back end 11020 of the semiconductor tool stations/systems 11090, 2010, 11090A, 11090B as a process module and/or a transfer chamber. In one aspect, the manipulating device 12000 may be coupled to the atmospheric front end 11000 in place of the vacuum back end 11020. As may be realized, manipulating device 12000 incorporating aspects of the disclosed embodiment could store a multitude of different shaped and/or sized substrates in a common housing using a common end effector.

Figure 14A:
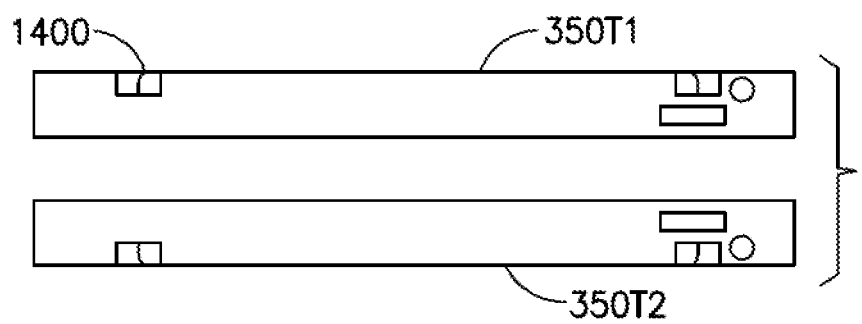
FIGS. 14A-14C are schematic illustrations of a portion of a substrate transport apparatus in accordance with aspects of the disclosed embodiment.
Figure 14B:
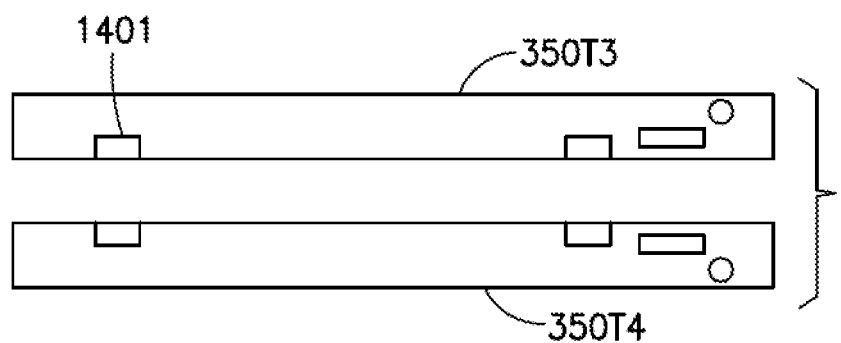
Figure 14C:
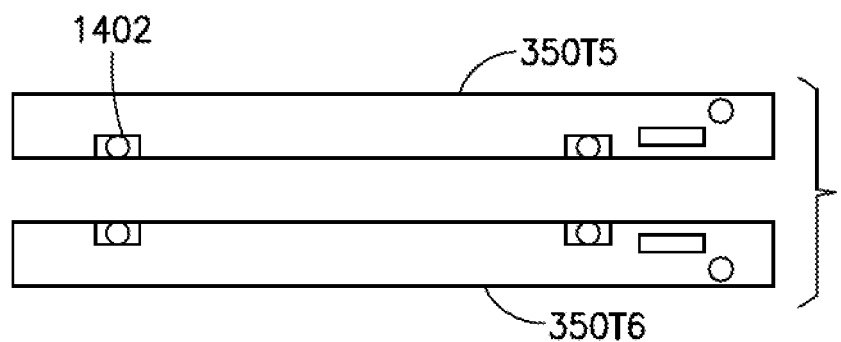

Referring to FIGS. 3A-6B, schematic illustrations are shown comparing, for example, ideal sensor locations for mapping substrates at a substrate holding station with ideal end effector tine locations for handling the substrates. Here end effector 350, of any suitable substrate transport apparatus such as described above, includes a base portion 350B and one or more tines 350T1, 350T2 configured to hold and support a substrate. In one aspect each tine 350T1, 350T2 includes substrate contacts 800A-800D where the substrate contacts 800A-800D are one or more of vacuum backside contacts, passive edge contacts, passive backside contacts or any other suitable substrate contact. In one aspect, the tines 350T1, 350T2 are interchangeable in any suitable manner with other sets of tines 350T3, 350T4 and 350T5, 350T6 as illustrated in FIGS. 14A-14C where each set of tines 350T1-350T6 has a different predetermined characteristic such as a substrate contact type. For example, FIG. 14A illustrates passive edge contacts 1400 on tines 350T1, 350T2, FIG. 14B illustrates passive backside contacts 1401 on tines 350T3, 350T4 and FIG. 14C illustrates vacuum backside contacts on tines 350T5, 350T6. In this aspect, the end effector includes two tines 350T1, 350T2 while in other aspects the end effector may be a paddle end effector having substrate contacts that are movable in accordance with the aspects of the disclosed embodiment.

Here the tines 350T1, 350T2 include one or more sensors 360A, 360B disposed on the tines 350T1, 350T2. In one aspect, the sensors 360A, 360B are disposed at a distal end of the tines (e.g. opposite the base portion 350B) where the sensors 360A, 360B form a through-beam sensor having a transmitter disposed on one tine 350T1, 350T2 and receiver disposed on the other tine 350T1, 350T2. The sensors 360A, 360B may be connected to any suitable controller, such as controller 11091 and configured, with for example the controller 11091, to map the substrates as described herein for determining at least one of substrate position within the substrate holding station, substrate shape, substrate bow, and substrate warp. The controller 11091 is configured to determine, in any suitable manner, a substrate support seat dimension span DS for each mapped substrate based on the mapping data received from the sensors 360A, 360B. In one aspect, the substrate support seat dimension span DS is dependent on the substrate size, substrate shape, substrate warp and/or substrate bow. In one aspect, the mapping data for each substrate is registered in the controller so that the controller may effect on the fly variations in the substrate support seat dimension span DS as the transport apparatus moves the end effector for picking substrates as described herein. In other aspects, the substrate support seat dimension span DS may be determined on the fly as the transport apparatus moves the end effector for picking substrates as described herein.

Figure 4B:
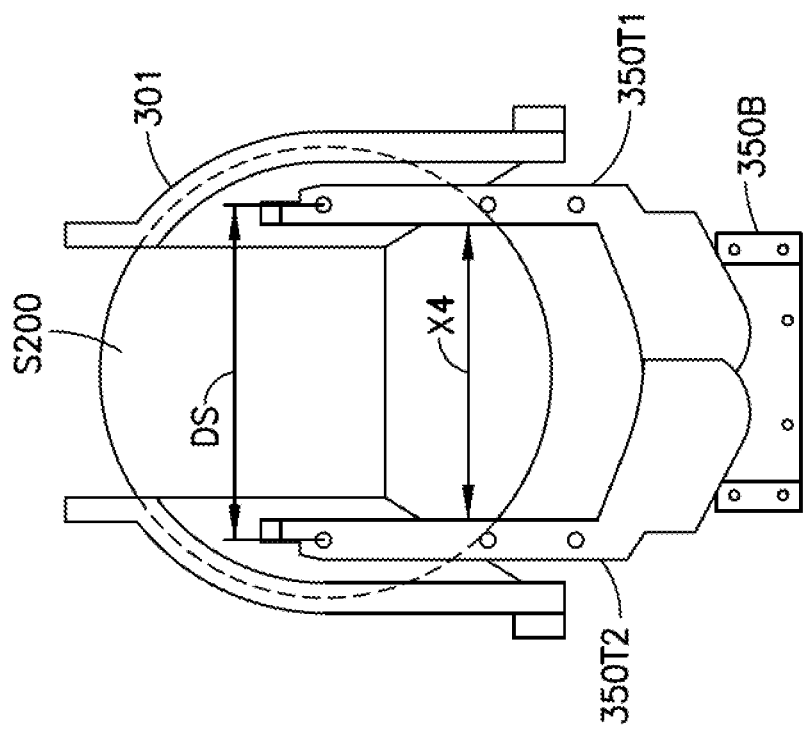
FIGS. 4A and 4B are schematic illustrations of a portion of a substrate transport apparatus in accordance with aspects of the disclosed embodiment.
Figure 4A:
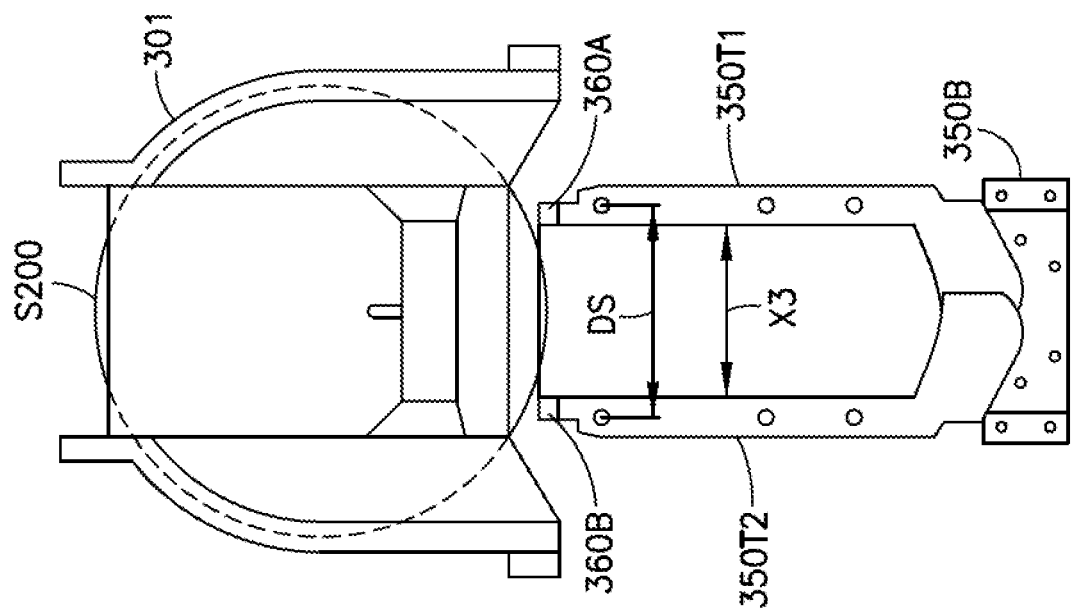
Figure 6B:
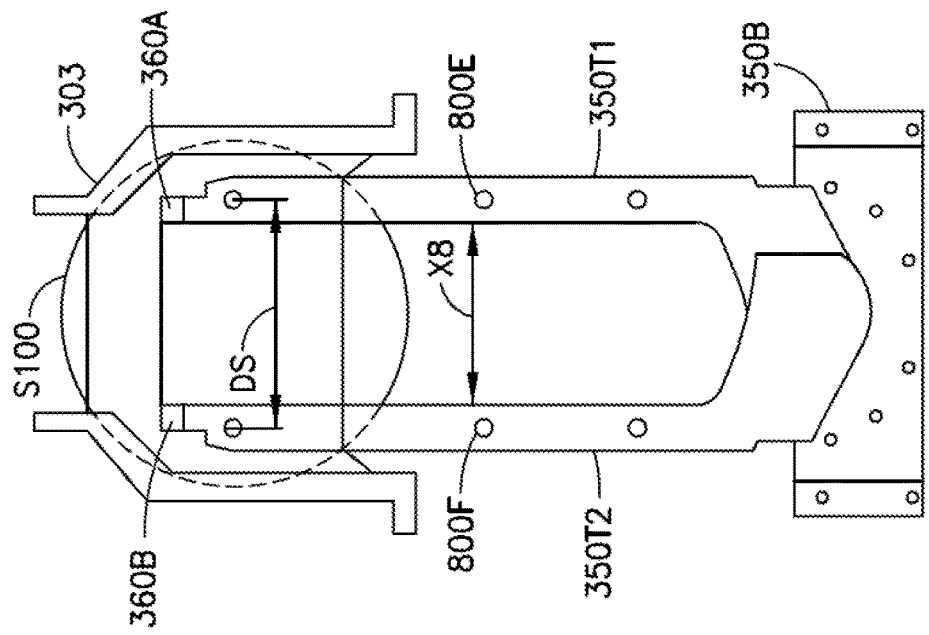
FIGS. 6A and 6B are schematic illustrations of a portion of a substrate transport apparatus in accordance with aspects of the disclosed embodiment.
Figure 6A:
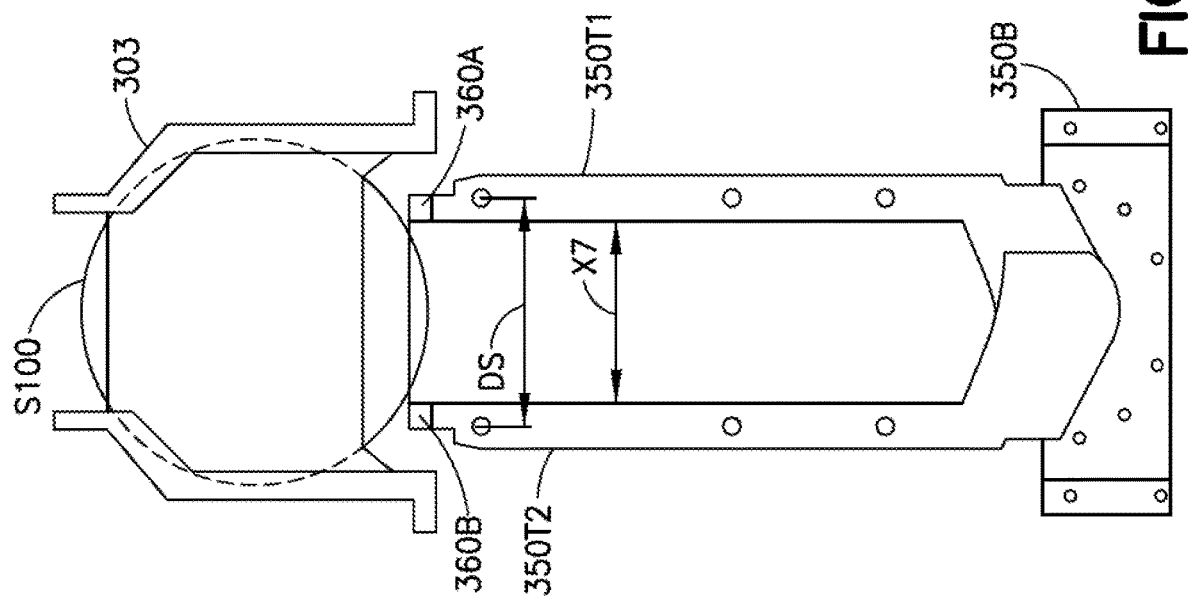

Referring to FIGS. 3A and 3B, for exemplary purposes only, at least one 300 mm substrate S300 is illustrated as being located at substrate holding station 300. In this aspect, the mapping sensors 360A, 360B are located in close proximity to the substrates S300 for mapping the location of the substrates S300. Here the tines 350T1, 350T2 are spaced a distance X1 from each other for placing the sensors 360A, 360B in an ideal spatial arrangement suitable for mapping the substrates S300. However, to handle the substrates S300 at an ideal contact location of the substrates S300 the tines 350T1, 350T2 are spaced a distance X2 from each other where the distance X2 is greater than the distance X1. Similarly, FIGS. 4A and 4B illustrate, for exemplary purposes only, at least one 200 mm substrate S200 located at substrate holding substrate S200 where a scanning/mapping distance between the tines 350T1, 350T2 is distance X3 and a substrate handling distance between the tines 350T1, 350T2 is distance X4 where distance X4 is greater than distance X3. FIGS. 5A and 5B illustrate, for exemplary purposes only, at least one 150 mm substrate S150 located at substrate holding station 302 where a scanning/mapping distance between the tines 350T1, 350T2 is distance X5 and a substrate handling distance between the tines 350T1, 350T2 is distance X6 where distance X6 is greater than distance X5. FIGS. 6A and 6B illustrate, for exemplary purposes only, at least one 100 mm substrate S100 located at substrate holding station 303 where a scanning/mapping distance between the tines 350T1, 350T2 is distance X7 and a substrate handling distance between the tines 350T1, 350T2 is distance X8 where distance X8 is greater than distance X7. The aspects of the disclosed embodiment described herein provide for the repositioning of at least one of the tines 350T1, 350T2 of end effector 350 so that the tines 350T1, 350T2 are located a distance X1, X3, X5, X7 apart for positioning the sensors 360A, 360B at the ideal scanning position of the respective substrates S300, S200, S150, S100.

The aspects of the disclosed embodiment described herein provide for the repositioning of at least one of the tines 350T1, 350T2 of end effector 350 so that the tines 350T1, 350T2 are located a distance X2, X4, X6, X8 apart for positioning the tines 350T1, 350T2 at the ideal substrate handling position of the respective substrates S300, S200, S150, S100. It should be understood that while only 300 mm, 200 mm, 150 mmm and 100 mm substrates are illustrated in FIGS. 3A-6B, in other aspects, the aspects of the disclosed embodiment provide for handling substrates of any suitable shapes and sizes. It is noted that the aspects of the disclosed embodiment, through repositioning of the tines 350T1, 350T2, allow users of semiconductor tool stations such as those described herein to handle different materials using common equipment (e.g. a common transport apparatus having a common end effector that is common to multiple different sized substrates as described herein) which increases throughput and decreases machine setup and/or down time.

Figure 13C:
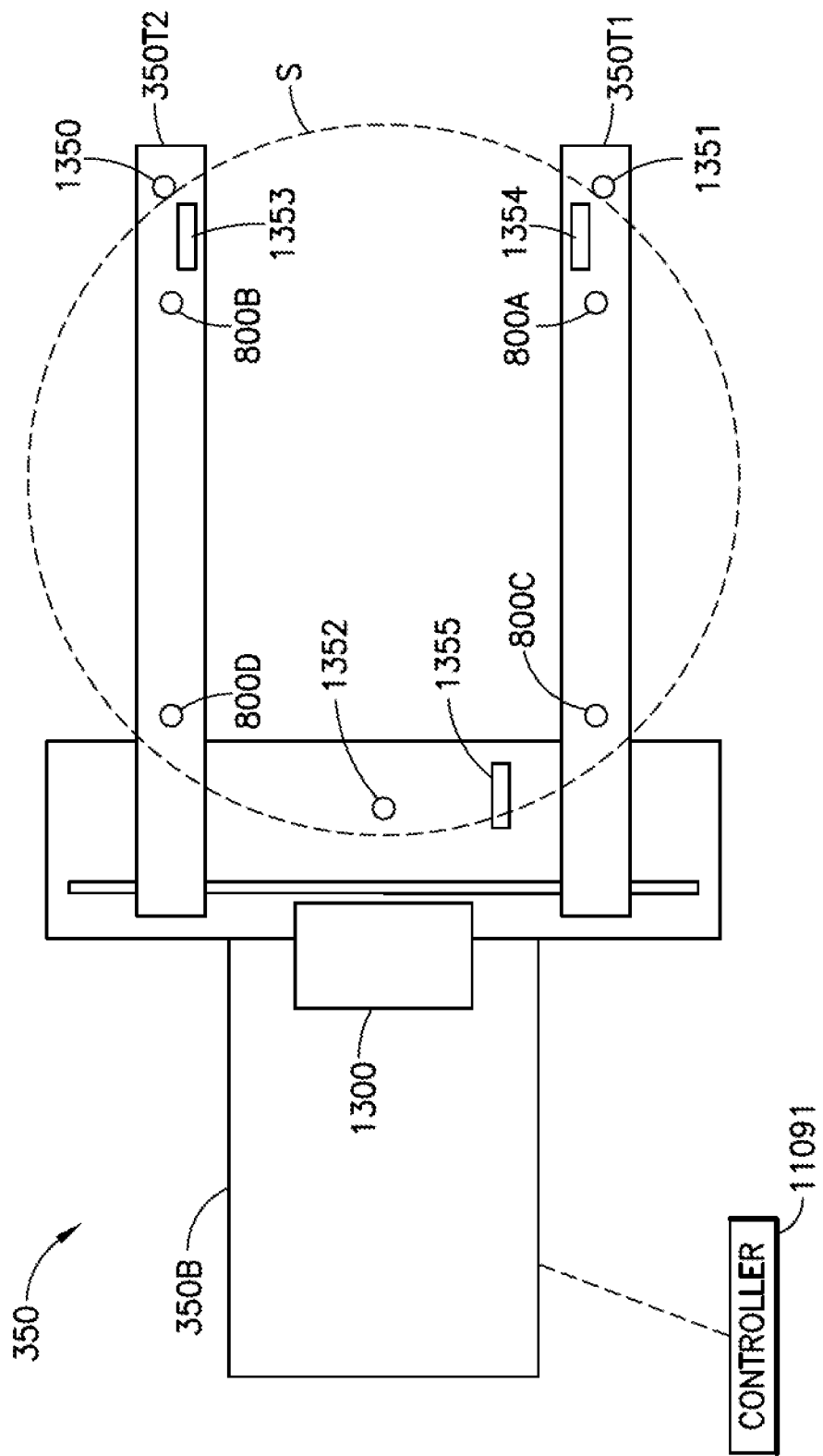

In one aspect, referring to FIGS. 13A, 13B, as noted above, the transport apparatus (such as those described above) includes a camera 1300 disposed on the transport apparatus. In this aspect the camera 1300 is located on the base portion 350B of the end effector 350 but in other aspects the camera 1300 may be located on any suitable link of the transport apparatus. In still other aspects, the camera may be located off of the transport apparatus, such as at a stationary location of the semiconductor tool station (e.g. in the front end module, load lock, processing module, transfer chamber, etc.). In one aspect, the camera 1300 is configured, with for example controller 11091, to image one or more substrates located on the end effector and/or at locations remote from the end effector such as a substrate holding station. In one aspect, the camera 1300 is configured, with for example controller 11091, to detect a presence of substrate(s) on the end effector 350. In one aspect, the camera 1300 is configured, with for example the controller 11091, to simultaneously map one or more substrates at one or more substrate holding stations from, for example, a single image of the substrates at the one or more substrate holding stations for determining one or more of a substrate position within the substrate holding station, a substrate size, a substrate shape, substrate bow and substrate warp. The controller 11091 is configured to determine, in any suitable manner, a substrate support seat dimension span for each mapped substrate based on the mapping data received from the camera 1300. In one aspect the camera may be provided in lieu of the sensors 350A, 350B while in other aspects, the camera may be employed in conjunction with the sensors 360A, 360B. As may be realized, substrate mapping throughput may be increased by the camera 1300 where, for example, a single picture of one or more substrate holding locations is taken on the fly and analyzed for mapping data while the substrate transport apparatus (such as those described above) is in motion, e.g. with or without carrying a substrate on the end effector 350.

In one aspect, the end effector may include any suitable sensor system for mapping and/or detecting substrates held by the end effector 350 or in close proximity to the end effector 350. For example, referring to FIG. 13C, in one aspect-one or more sensors 1350-1355 are mounted at fixed and known locations on the end-effector 350 to sense the location/presence and/or notch orientation of the substrate S with respect to the end-effector 350. Data collected by the sensors 1350-1355 is communicated to, for example, the controller 11091. In one aspect the controller 11091 calculates the center of the substrate S and the location of its notch or flat before the substrate S is gripped by the end effector 350 in a manner similar to that described in U.S. Pat. No. 8,016,541 issued on Sep. 13, 2011, the disclosure of which is incorporated herein by reference in its entirety. With the location data from the sensors 1350-1355, the known center of the end-effector 130 is positioned underneath the calculated center of the substrate S, the end-effector 350 is raised until the substrate support contact locations contacts 800A-800D contact the substrate S for picking the substrate S.

The sensors 1350-1355 can be of any suitable type, such as capacitive, optical, acoustic, or ultrasonic sensors. As an example, if a capacitive sensor is used, the capacitance increases as the sensor moves underneath a wafer. For each sensor, a voltage output, which is proportional to impedance, is generated where the detected capacitance is dependent on the distance from the sensors 1350-1355 to the bottom surface of the substrate S. This distance can vary if the substrate S is, for example, bowed, warped or tilted within the substrate holding station. The sensors 1350-1355 are located on the end effector 350 to pass underneath the substrate S so that the distance from the end effector to the wafer can be provided for picking the substrate and determining if a mispick occurred as will be described in greater detail below. In one aspect, the sensors 1350-1355 may also be used to determine if bowing, warping or tilting of a substrate is present (in addition to or in lieu of the camera 1300 and/or sensors 360A, 360B) and to improve the robustness of the system.

Figure 7A:
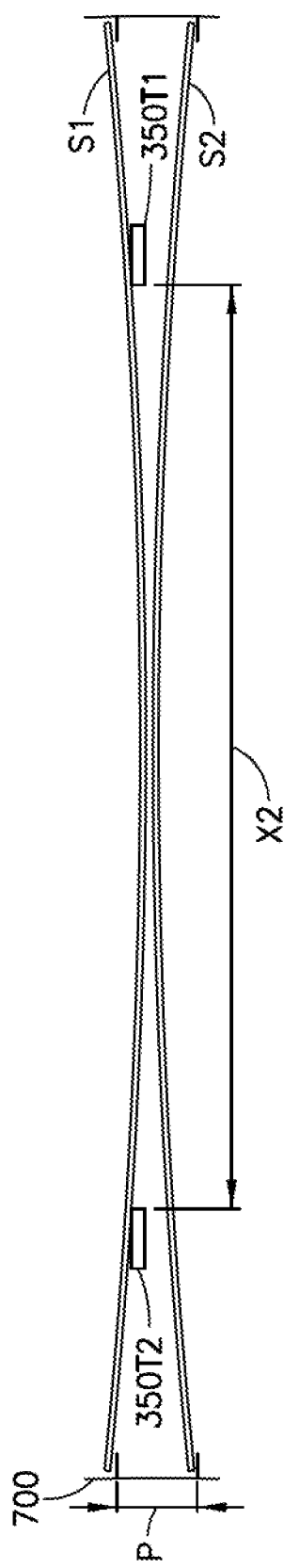
FIGS. 7A and 7B are schematic illustrations of a portion of a substrate transport apparatus in accordance with aspects of the disclosed embodiment.
Figure 7B:
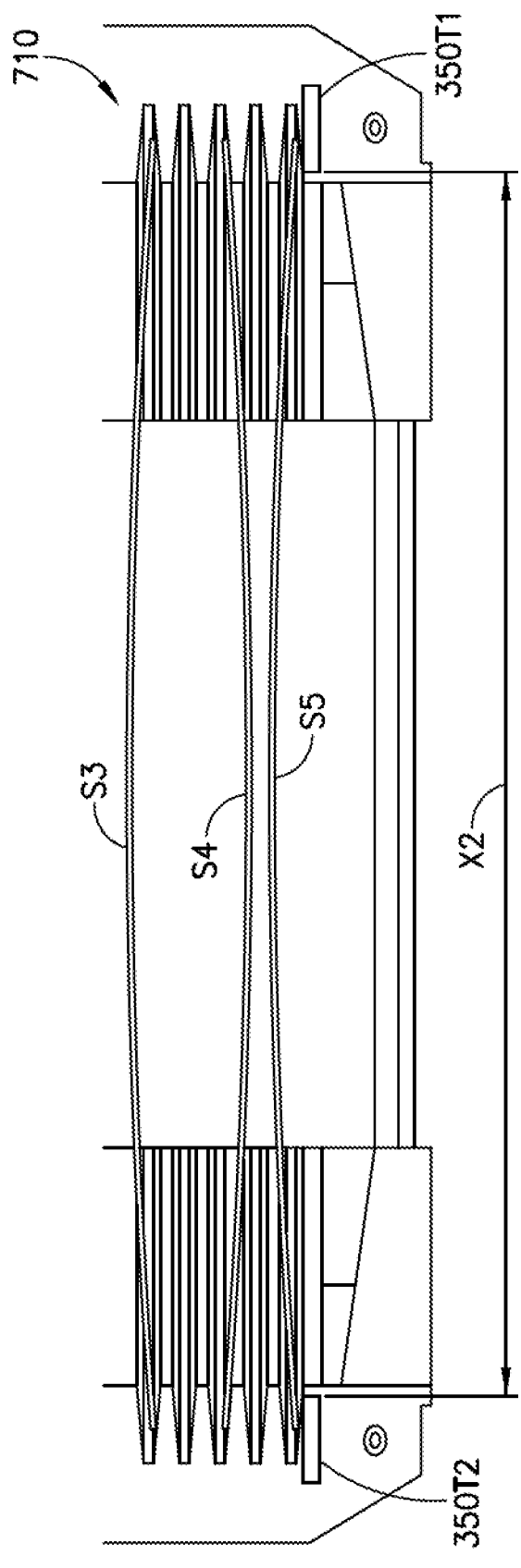

Referring now to FIG. 7A, a schematic illustration of substrates S1, S2 exhibiting bowing and/or warping are shown. Here the substrates are located at a substrate holding station 700 and are spaced a predetermined pitch P from one another. When handling substrates S1, S2 with a bowed and/or warped characteristic the tines 350T1, 350T2 of end effector 350 are placed at, for example, the extremities or peripheral edge(s) of the substrate S1, S2 (e.g. adjacent the peripheral edge of the substrate S1, S2) to be picked/placed to substantially avoid tine 350T1, 350T2 contact with other substrates at the substrate holding station. Placing the tines at the extremities of the substrate S1, S2 also prevents forcing flatness of the substrate which may affect substrate processing. The aspects of the disclosed embodiment provide for the placement of the tines 350T1, 350T2 at predetermined locations for each substrate S1, S2 for picking/placing substrates S1, S2 at the substrate holding station 700. Referring also to FIG. 7B, the substrate handling spacing X2, X4, X6, X8 (see FIGS. 3A-6B) between tines 350T1, 350T2 for handling larger substrates with a bowed and/or warped characteristic may not provide for transport of smaller substrates with a common end effector 350. For exemplary purposes only, substrates S1, S2 in FIG. 7A may be 300 mm substrates and the tines may be spaced apart a distance X2 for transporting at least the bowed/warped substrate S1; however, the distance X2 between the tines 350T1, 350T2 may interfere with substrate supports of a holding station 710 configured to hold smaller substrates, such as for example, 200 mm substrates S3, S4, S5. As noted above, the aspects of the disclosed embodiment provide for the adjustment of at least one tine 350T1, 350T2 relative to the other tine 350T1, 350T2 for changing the distance between the tines and the substrate support seat dimension span DS of the substrate contacts 800A-800D of the tines 350T1, 350T2 for handling substrates S1-S5 having different bow, warp, shape, and size characteristics with the common end effector 350.

Figure 8A:
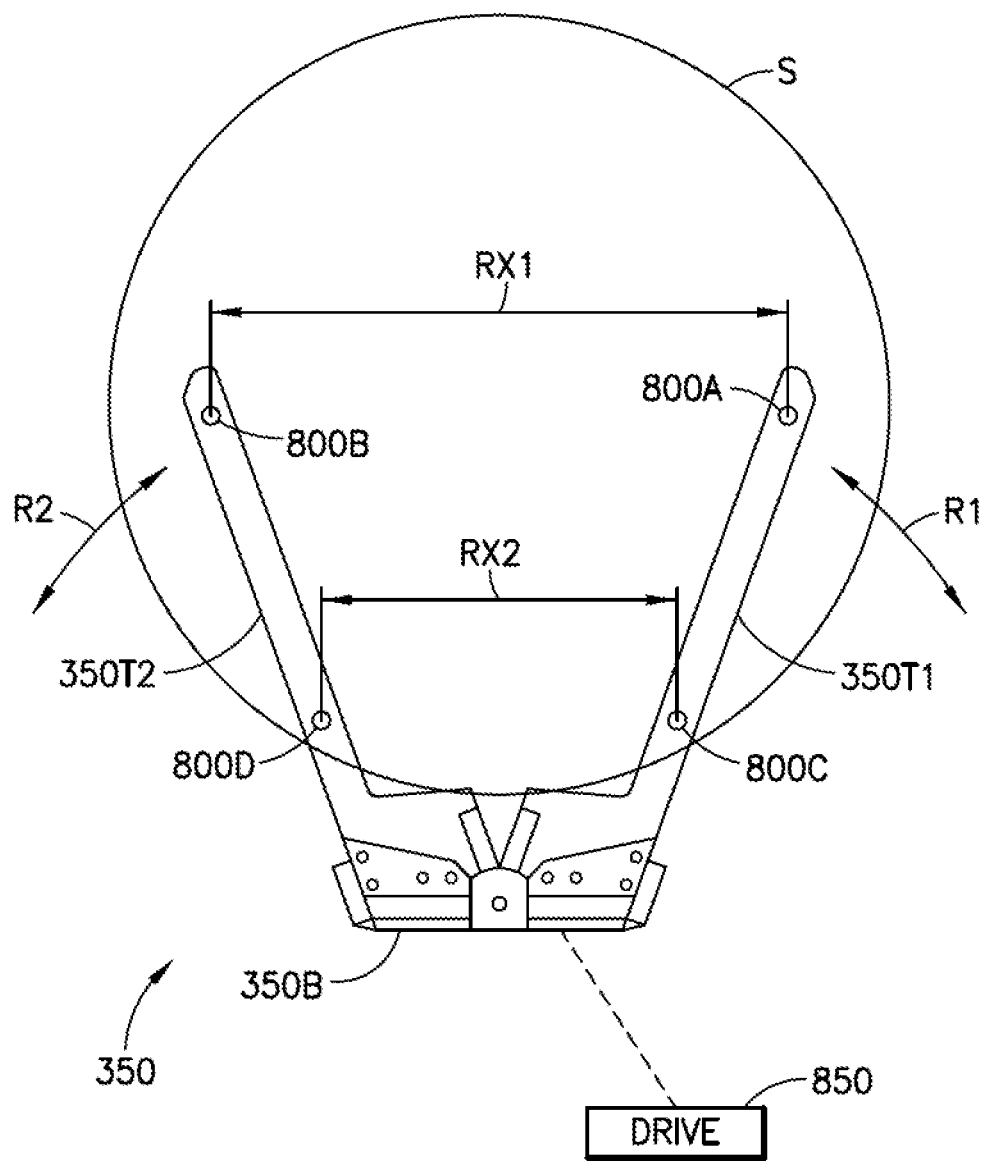
FIGS. 8A-8C are schematic illustrations of a portion of a substrate transport apparatus in accordance with aspects of the disclosed embodiment.
Figure 8C:
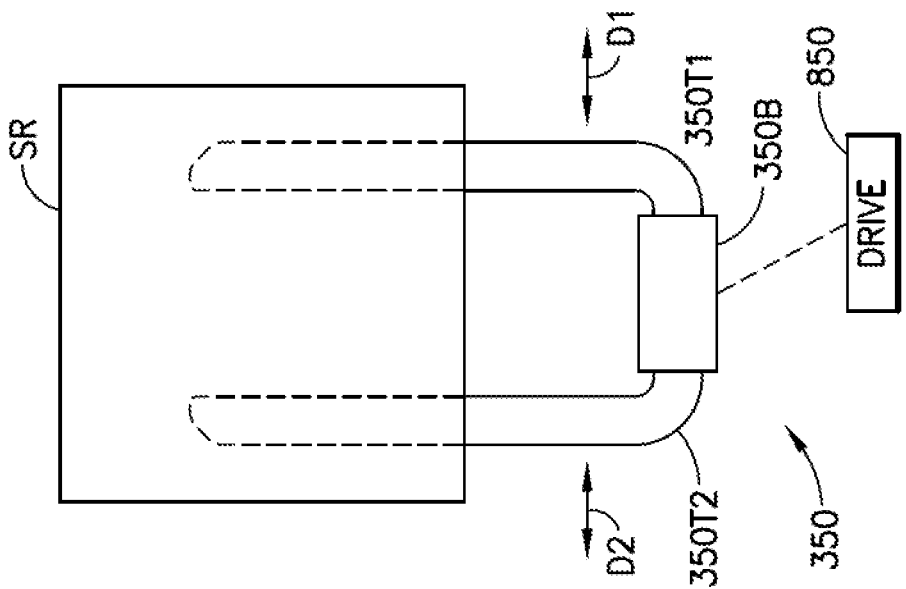
Figure 8B:
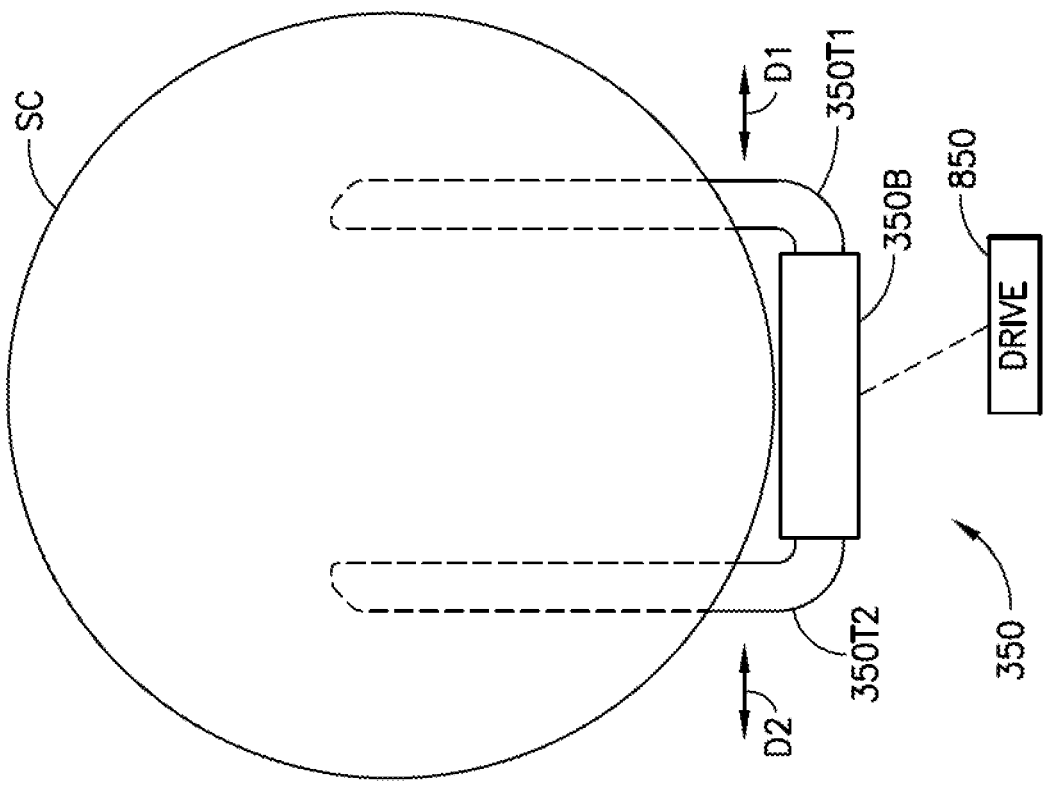

Referring to FIGS. 8A-8C, for adjusting the distance between the tines 350T1, 350T2 and the substrate support seat dimension span between the contacts 800A-800D (also referred to herein as the contact locations of the tines 350T1, 350T2), the tines 350T1, 350T2 are movably mounted to the base portion 350B of the end effector 350. In one aspect, as can be seen in FIG. 8A, the tines 350T1, 350T2 are pivotally mounted to the base portion 350B of end effector 350 in any suitable manner so that the tines 350T1, 350T2 move in respective directions R1, R2 for changing the distance RX1 between substrate contact locations 800A, 800B and the distance RX2 between the substrate contact locations 800C, 800D of the tines 350T1, 350T2. In one aspect, the tines 350T1, 350T2 are driven by any suitable drive section 850 of the end effector 350 so that a distance between the tines 350T1, 350T2 is varied (e.g. at least one of the tines is moved relative to the other tine) on the fly to change a substrate support seat dimension span DS (e.g. that corresponds with the distance between the tines) spanning between the substrate contacts 800A-800D of the tines 850T1, 850T2. In one aspect, the tines 350T1, 350T2 are pivotally mounted to the base portion 350B where the drive section includes any suitable linear and/or rotary drive components for pivoting one or more of the tines 350T1, 350T2 relative to each other and the base portion 350B for adjusting the distances RX1, RX2 between the substrate contacts 800A-800D of the tines 350T1, 350T2.

Figure 9:
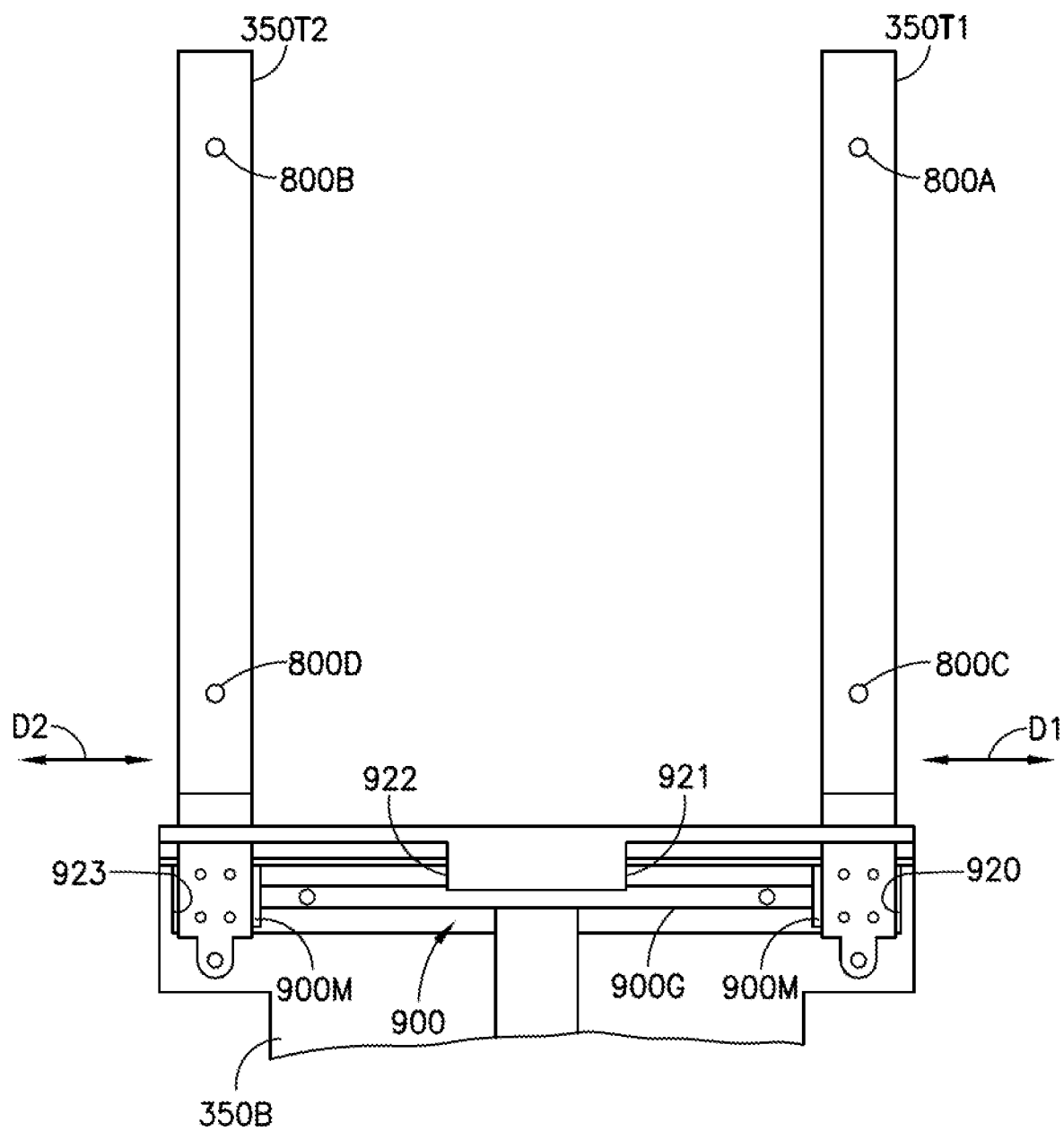
FIG. 9 is a schematic illustration of a portion of a substrate transport apparatus in accordance with aspects of the disclosed embodiment.

Referring to FIGS. 8B and 8C, in one aspect, the tines 350T1, 350T2 are mounted to the base portion 350B so that at least one of the tines 350T1, 350T2 is linearly movable in directions D1, D2 relative to each other and the base portion 350B. Here the end effector 350 is illustrated as holding a rectangular substrate SR and a circular substrate SC but in other aspects the substrate may have any suitable shape/size. In this aspect, the drive section 850 of the end effector 350 includes any suitable linear and/or rotary drive components for effecting movement of one or more of the tines 350T1, 350T2. Referring also to FIG. 9, in one aspect, the drive section 850 includes one or more suitable linear guides 900 including at least one linear guide member 900G and at least one movable member 900M that rides along the linear guide member 900G. In this aspect, each tine 350T1, 350T2 is mounted to a respective movable member 900M for traversal along the linear guide member 900G in directions D1, D2. In one aspect, one or more stops 920-923 are provided to limit the linear travel of the tines 350T1, 350T2. It is noted that while both tines 350T1, 350T2 are illustrated as being movable, as noted herein, in other aspects only a single tine may be movable. The movable members 900M may be driven in any suitable manner for traversing the linear guide member 900G.

Referring to FIGS. 10A and 10B, in one aspect, the drive section 850 of the end effector 350 includes a frog-leg linkage configured to move the tines 350T1, 350T2 in the directions D1, D2. For example, the frog-leg linkage includes a drive link 370 that is connected to pivoting links 371A, 371B at axes of rotation A1. The pivoting links 371A, 371B are connected to a respective driven link 372A, 372B at axes of rotation A3. The pivoting links 371A, 371B are pivotally mounted to the base portion 350B at respective axis of rotation A2A, A2B and the driven links 372A, 372B are coupled to a respective moving member 900M. Any suitable actuator 850A of the drive section 850 is connected to the drive link 370 for reciprocably moving the drive link 370 in direction D3 where movement of the drive link 370 towards the tines 350T1, 350T1 causes rotation of the pivoting links 371A, 371B about, axes A2A, A2B so that axes A3 of the pivoting links 371A, 371B move in directions R3, R4 towards each other. Movement of axes A3 in directions R3, R4 causes movement of the driven links towards each other for bringing the tines 350T1, 350T2 closer together and decreasing the distance DS between substrate contacts 800A-800D of the tines 350T1, 350T2. Conversely, movement of the drive link 370 away from the tines 350T1, 350T1 in direction D3 causes rotation of the pivoting links 371A, 371B about, axes A2A, A2B so that axes A3 of the pivoting links 371A, 371B move in directions R3', R4' away from each other. Movement of axes A3 in directions R3', R4' causes movement of the driven links away from each other for moving the tines 350T1, 350T2 further apart increasing the spacing/distance between the tines 350T1, 350T2 and increasing the distance DS between substrate contacts 800A-800D of the tines 350T1, 350T2.

Referring now to FIGS. 11A and 11B, in one aspect, the drive section 850 of the end effector 350 includes a drive linkage having a drive link 370' and driven links 372A', 372B'. The drive link 370' is connected to any suitable actuator 850A in a manner similar for movement in direction D3. Each driven link 372A', 372B' is connected at one end to the drive link 370' about axis A4 and at the other end to the respective movable member 900M about axis A5. Here, movement of the drive link 370' towards the tines 350T1, 350T2 in direction D3 causes movement of the movable members 900M away from each other in directions D1, D2 for moving the tines 350T1, 350T2 further apart increasing the spacing between the tines 350T1, 350T2 and increasing the distance DS between substrate contacts 800A-800D of the tines 350T1, 350T2. Movement of the drive link 370' away from the tines 350T1, 350T2 in direction D3 causes movement of the movable members 900M towards each other in directions D1, D2 for moving the tines 350T1, 350T2 closer together and decreasing the distance DS between substrate contacts 800A-800D of the tines 350T1, 350T2.

Referring to FIGS. 12A and 12B, the drive section 850 of the end effector 350 includes a ball screw drive. The ball screw drive includes a screw member 1201 mounted to the base portion 350B of the end effector 350. The screw member 1201 includes a drive portion 1200 that connects the screw member 1201 to any suitable actuator 850A through any suitable transmission 1200T (such as a belt, band, cable, gears, etc.) where when actuated the actuator 850A causes rotation of the drive portion 1200 (and hence the screw member 1201 ) about a longitudinal axis of the screw member 1201. Driven members 1202, 1203 are mounted to the screw member 1201 where the driven members 1202, 1203 are coupled to and are rotationally fixed by the respective movable member 900M so that as the screw member 1201 rotates the driven members move in directions D1, D2 along the screw member 1201 for increasing or decreasing the distance between the tines 350T1, 350T2 and increasing or decreasing the distance DS between the substrate contacts 800A-800D of the tines 850T1, 850T2.

While FIGS. 8A-12B illustrate exemplary drive section 850 configurations it should be understood that in other aspects the drive section 850 of the end effector 350 may have any suitable configuration for increasing or decreasing the distance between the tines 350T1, 350T2 and hence increasing or decreasing the distance between the substrate contacts of the tines 350T1, 350T2.

In operation, the controller 11091, for example, is configured to, in one aspect, vary the distance between the tines 350T1, 350T2 and hence change the substrate support seat dimension span DS spanning between the substrate contacts 800A-800D of the tines 350T1, 350T2 on the fly during movement of the substrate transport apparatus. In one aspect, the distance DS may be varied from one substrate to another substrate, in the same or different batch of substrates, to compensate for one or more predetermined characteristics of the individual substrates, where the predetermined characteristics include an amount of bow of the substrates, an amount of warp of the substrate (where bow and warp define the flatness of the substrate), a shape of the substrate, and a size of the substrate (e.g. the diameter for circular substrates, a length/width for rectangular substrates, etc.). As may be realized, the bow or warp of the substrate may affect the size of the substrate where a bowed and/or warped substrate may have a smaller size than a corresponding nominally sized substrate (e.g. a bowed and/or warped 300 mm wafer may have a smaller diameter/size than 300 mm). As an example, the distance DS may be varied substrate by substrate for a plurality of substrates located in a common stack (e.g. where the substrates have a common nominal diameter that, varies within a predetermined tolerance and depending on the bow and/or warp of the substrates). As another example, the distance DS may be varied between substrates located in different stacks such as where the substrates in one stack have a predetermined common nominal diameter and the substrates in another different stack have a different predetermined common nominal diameter (e.g. one stack includes 300 mm substrates while another stack includes 200 mm substrates).

Figure 17:
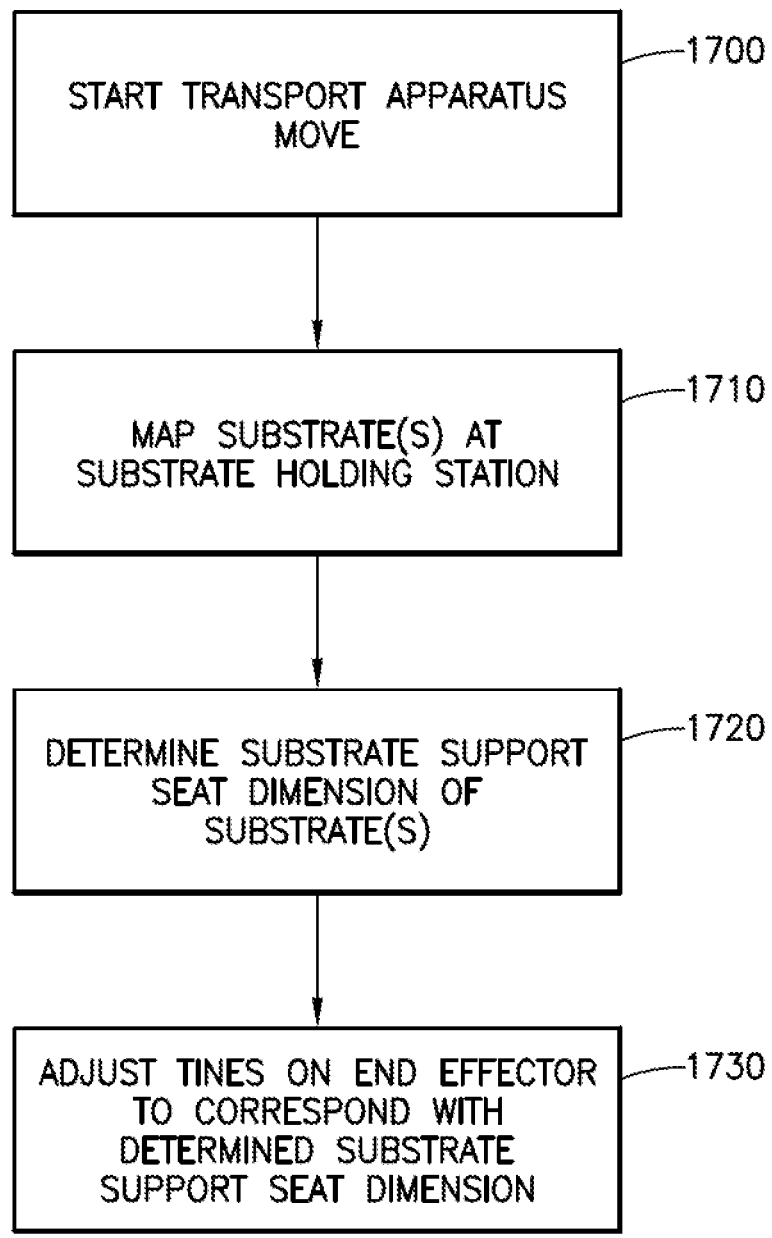
FIG. 17 is a flow diagram in accordance with aspects of the disclosed embodiment.

For example, referring also to FIG. 17, in one aspect, the controller 11091 may effect movement of the substrate transport and the end effector 350 towards a substrate holding station for picking a substrate (FIG. 17, Block 1700). During or coincident with movement (e.g. on the fly in a common motion of the transport apparatus) towards the substrate holding station, e.g. camera 1300 and/or sensors 360A, 360B provide mapping data to the controller 11091 for one or more substrates located at the substrate holding location (FIG. 17, Block 1710). Where sensors 360A, 360B are employed for mapping, the controller adjusts the tines 350T1, 350T2 to the mapping positions illustrated in, for example, FIGS. 3A, 4A, 5A and 6A where a nominal size of the substrates at the substrate holding station is previously provided to the controller 11091. The mapping data is provided to the controller 11091 during movement of the transport apparatus (e.g. on the fly in the common motion of the transport apparatus) towards the substrate holding station and the controller 11091 determines the substrate support seat dimension span of one or more substrates at the substrate holding station (FIG. 17, Block 1720). The controller 11091 effects movement of the tines 350T1, 350T2 of the end effector 350, on the fly in the common motion, to adjust a spacing between the tines so that the distance DS between the substrate contacts 800A-800D of the tines 350T1, 350T2 correspond with (e.g. substantially matches) the determined substrate support seat dimension span of a substrate to be picked (FIG. 17, Block 1730).

In one aspect, referring FIG. 9, the movement, of the tines 350T1, 350T2 between two positions (e.g. defining at least two different substrate support seat dimension spans) may be controlled by, for example, mechanical stops 920, 921, 922, 923 of the end effector 350 where movement is effected by the end drive section 850 of the end effector which may be under control of the controller 11091. In one aspect, the stops 920, 921, 922, 923 are located at the extremes of the tine 350T1, 350T2 motion providing the two different substrate support seat-dimension spans.

In one aspect, the movement of the tines 350T1, 350T2 may be controlled, in any suitable manner such as by controller 11091, so as to have a variable/reconfigurable substrate support seat dimension span DS where the distances DS comprises a range of, such as two or more, different substrate support seat dimension span positions at which the tines 350T1, 350T2 engage substrates. In one aspect, referring again to FIGS. 3A-6B, the tines 350T1, 350T2 have common substrate contacts 800A-800F, each of which engage substrates in each of the substrate support seat dimension span positions. For example, where substrates of substantially similar sizes are located in a stack the common substrate contacts engage each of the substrate in the stack when the respective substrates are picked. In one aspect, the common substrate contacts (see also contacts 800E, 800F) engage different substrates such as when the substrates have different sizes and the tines 350T1, 350T2 are located at the respective substrate support seat dimension span positions for the different size substrates.

Figure 15A:
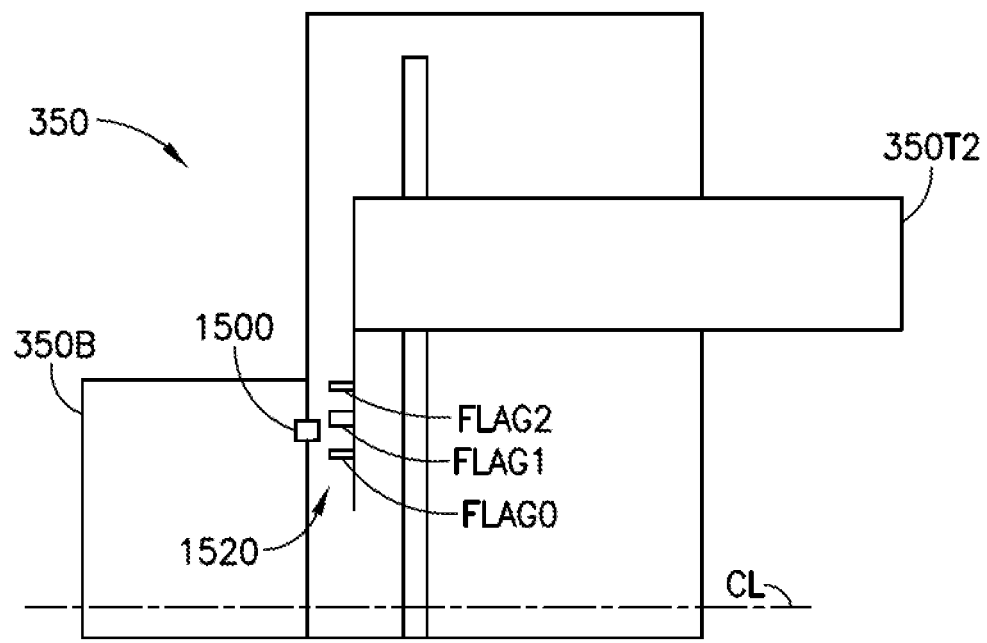
FIGS. 15A and 15B are schematic illustrations of a portion of a substrate transport apparatus in accordance with aspects of the disclosed embodiment.
Figure 15B:
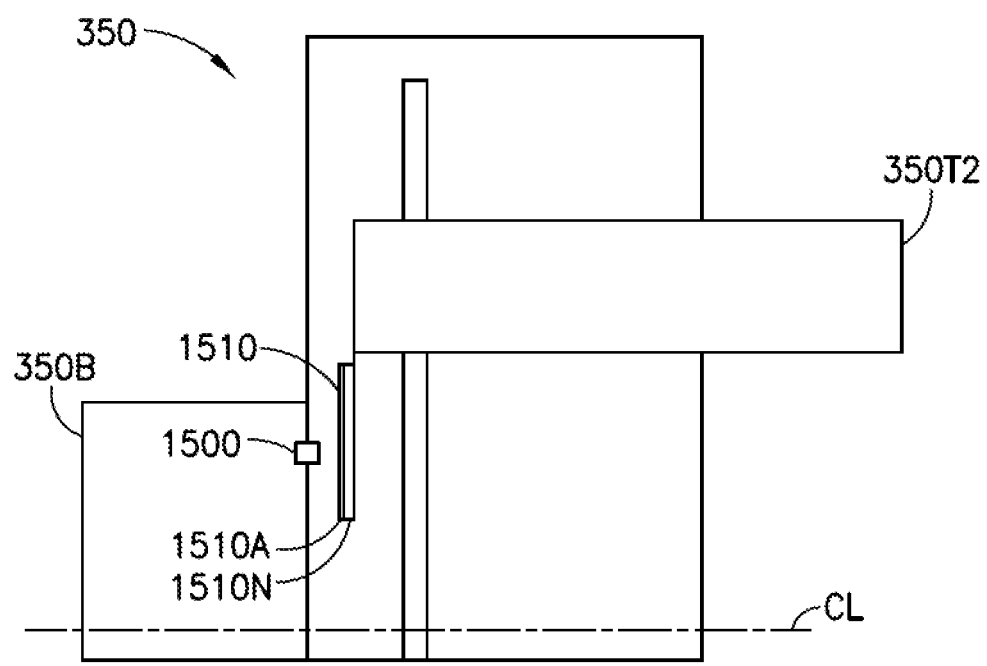

Referring to FIGS. 15A and 15B, in one aspect the range of different substrate support seat dimension span positions is effected by determining, with the controller 11091, a position of the tines 350T1, 350T2 relative to each other and/or the base (such as a reference feature of the base portion 350B where in one aspect the reference feature is a known center line CL of the base portion 350B). In one the end effector 350 includes any suitable sensor system for tracking/determining the position of the tines 350T1, 350T2. It is noted that while both tines 350T1, 350T2 are described as being movable it should be understood, as noted above, that in some aspects only a single tine may be movable. In one aspect, the sensor system includes any suitable sensor(s) 1500 which may be capacitive, inductive, optical, etc. The sensor 1500 interfaces with the respective tine 350T1, 350T2 in any suitable manner for sensing a position of the respective tine 350T1, 350T2. As may be realized, where the movement of the tines 350T1, 350T2 is coupled such as through the ball screw, frog leg or other linkages described above where a single drive operates to move both tines, a single sensor may be provided to sense the position of one tine 350T1, 350T2 as the location of the other tine 350T1, 350T2 would be automatically known based on the coupled movement and a predetermined known relationship between the tines 350T1, 350T2. In some embodiments, the movement of the tines 350T1, 350T2 is independent. For example, tines 350T1, 350T2 may be moved at different times, at different rates, and/or to positions which are not symmetrical about a center line of the end effector 350. Where the movement of the tines 350T1, 350T2 is independent a sensor may be provided for each independently movable tine.

In one aspect, one or more of the tines 350T1, 350T2 includes a sensor track 1510 that forms one or more of an absolute encoder 1510A and an incremental encoder 1510N. The sensor 1500 is positioned on the end effector 350 to sense the sensor track 1510 for determining, with the controller 11091, the position of the one or more tines 350T1, 350T2 relative to each other or a known position of the end effector, such as the centerline CL of the end effector 350. Determining the position of the tines 350T1, 350T2 with the sensor track 1510 effects positioning of the tines 350T1, 350T2 anywhere along the range of motion of the tines 350T1, 350T2 so that the substrate contacts 800A-800D of the tines 350T1, 350T2 are positioned at a predetermined substrate engagement position that corresponds with a determined substrate support seat dimension span position for any given substrate.

In one aspect, one or more of the tines 350T1, 350T2 includes one or more flags 1520 that interface with the sensor (s) 1500 for determining, with the controller 11091, a position of one or more of the tines 350T1, 350T2. In one aspect, the one or more flags 1520 may be positioned to form one or more of an absolute and incremental encoder so that the position of the tines 350T1, 350T2 may be adjusted over the range of motion of the tines 350T1, 350T2. In other aspects, the flags may be located at predetermined positions that correspond with predetermined substrate support seat dimension span positions of the end effector. In one aspect, each flag 1520 may be individually identifiable so that a position determination of the tines 350T1, 350T2 may be effected from sensing but one flag 1520. In other aspects, the controller 11091 may be configured to "count" (e.g. additively or subtractively) the number of flags detected for serially determining the location of the tine(s) 350T1, 350T2.

In one aspect, the flags 1520 and/or sensor track 1510 may effect with the controller 11091 fault recovery of the transport apparatus end effector 350 in, for example, the event of a power loss or emergency stop substantially without human/operator intervention within the semiconductor tool station. For example, in one aspect, a position of the tines 350T1, 350T2 as determined with the flags 1520 and/or sensor track 1510 may be registered in a memory of the controller 11091 upon power loss so that when power is restored the controller 11091 reads the position of the tines 350T1, 350T2 (as located before power loss) from memory. Where the last known location of the tines 350T1, 350T2 is registered in the controller 11091 any auto-initialization of the end effector may be disabled when the power is restored so that the end effector continues to operate based on the registered position of the tines 350T1, 350T2.

In one aspect, where auto-initialization is provided when power is restored to the transport apparatus, the absolute encoder noted above (e.g. provided by the sensor track 1510 or flags 1520) may provide the position of the tines 350T1, 350T2 when power is restored. In one aspect, where the absolute encoder is provided by the flags 1520, the flags 1520 may include n number of flags where each flag corresponds to a predetermined substrate support seat dimension span position of the tines 350T1, 350T2. For example, flag 0 may corresponds to an open position of the tines, flag 1 may correspond to a first substrate support seat dimension span position, flag 2 may correspond to a second substrate support seat dimension span position and flag n may correspond to an nth substrate support seat, dimension span position.

Figure 16:
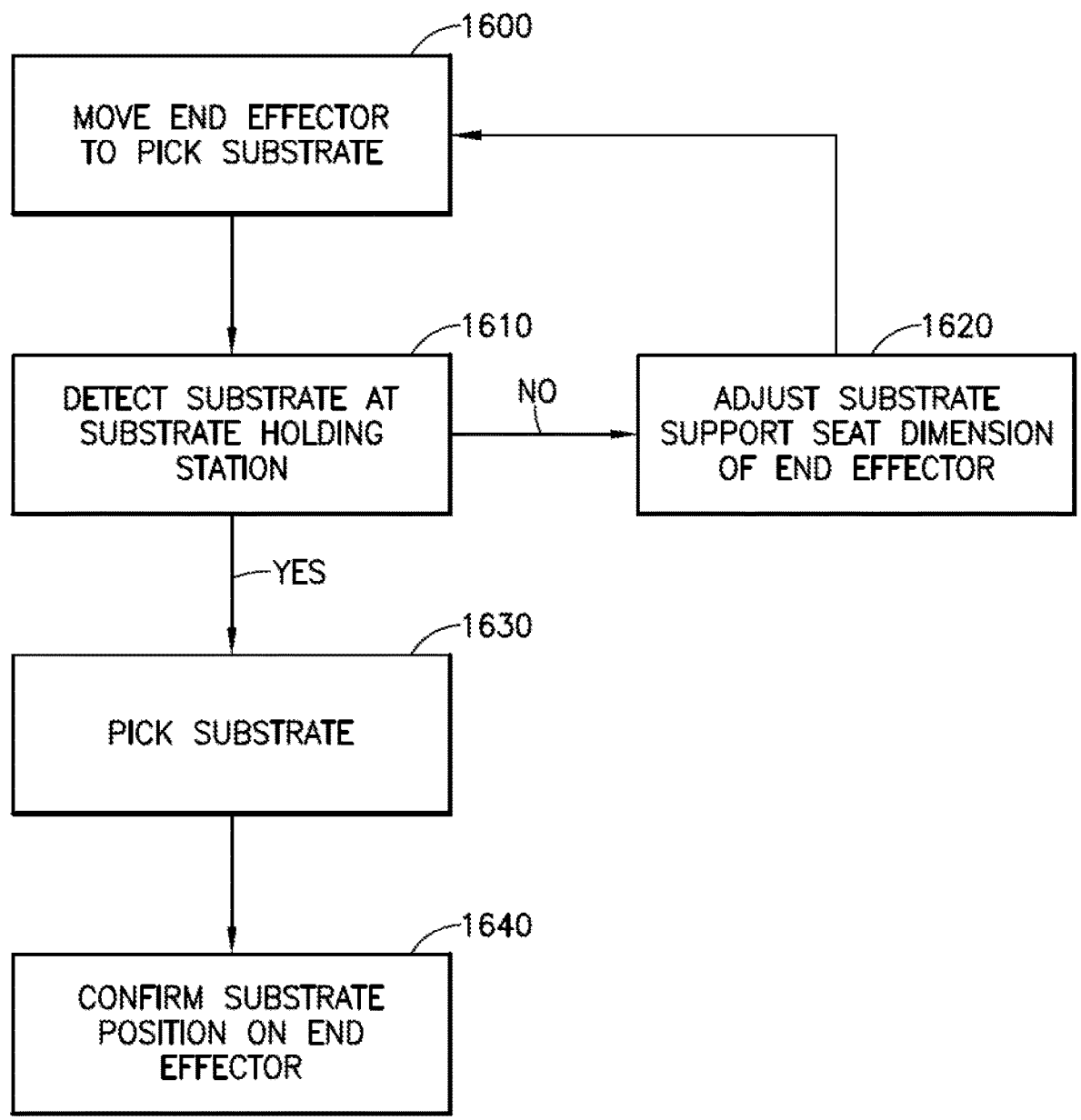
FIG. 16 is a flow diagram in accordance with aspects of the disclosed embodiment.

Referring to FIGS. 13C, 15A, 15B and 16 the end effector 350 and controller 11091 are configured to provide a feedback loop for repositioning the end effector 350 and tines 350T1, 350T2 when a substrate mispick is detected. The controller 11091 positions the end effector 350 at a predetermined location of a substrate holding station and effects adjustment of the tines 350T1, 350T2 so that the substrate support seat dimension span DS position of the end effector 350 substantially matches the substrate support seat dimension span of the substrate to be picked as described above. The controller 11091 effects a predetermined amount of movement of the end effector 350 to pick the substrate (FIG. 16 Block 1600). In one aspect, one or more of the sensors 1350-1355 and/or camera 1300 send substrate detection signals to the controller 11091 where the signals indicate a presence or absence of the substrate on the end effector 350 (FIG. 16, Block 1610). In one aspect, a capacitance or inductance of the sensors 1350-1355 or an image from the camera 1300 may indicate a distance between the sensors 1350-1355 (and hence the substrate contacts 800A-800D) and the substrate. Where the presence of the substrate is detected on the end effector the substrate is picked (FIG. 16, Block 1630) and the substrate position on the end effector is confirmed (FIG. 16, Block 1640) in any suitable manner such as with sensors 1350-1355 and/or camera 1300.

Where the presence of the substrate is not detected on the end effector 350, the controller effects an incremental movement of the tines 350T1, 350T2 to adjust the substrate support seat dimension span DS position of the end effector 350 (FIG. 16, Block 1620). In one aspect, the adjustment of the substrate support seat dimension span DS position is effected by the flags 1520 and/or sensor track 1510 where the absolute, incremental or serial scales provided by the flags 1520 and/or sensor track 1510 provide feedback to the control with respect to the position of the tines 350T1, 350T2. The incremental movement of the tines 350T1, 350T2 may be any suitable predetermined distance. As may be realized, the incremental movement, of the tines 350T1, 350T2 may be performed after the end effector is retracted from the substrate holding station and/or after the end effector is returned to a pick position of the end effector (e.g. to provide clearance between the tines 350T1, 350T2 and the substrate within the substrate holding station). The end effector 350 is repositioned to pick the substrate (FIG. 16, Block 1600) and a substrate presence determination is made after the pick attempt to determine whether the substrate is present on the end effector 350 (FIG. 16, Block 1610). If the substrate is present the substrate is picked and its position is confirmed (FIG. 16, Blocks 1630, 1640). If the presence of the substrate is not detected blocks 1600-1620 are repeated over a predetermined range of tine 350T1, 350T2 movement or until the presence of the substrate is detected in block 1610. In one aspect, where the tines are moved over the predetermined range and the presence of the substrate is not detected an error may be generated and the controller 11091 may effect a re-mapping of the substrate holding station to determine the source of the mispick and/or to update mapping data for substrates within the substrate holding station.

Referring again to FIGS. 1E, 1F and 3A-6B as described herein the controller and end effector 350 are configured to vary the distance X1-X8 between the end effector 350 tines 350T1, 350T2 and hence the distance DS between the substrate contacts 800A, 800C of one tine 350T1 relative the substrate contacts 800B, 800D of the other tine 350T2 based on one or more predetermined characteristics (e.g. size, bow, warp, etc.) of the substrates being transported. As can be seen in FIGS. 1E and 1F the semiconductor tool stations 1090A, 11090B are configured for processing substrates having different sizes. For example, substrate S2 has a predetermined nominal size where substrate S1 has a size that is less than the predetermined nominal size of substrate S2 and substrate S3 has a size that is greater than the predetermined nominal size of substrate S2. In one aspect, the substrate transports 11013, 11014 each include end effector 350, while in other aspects, the substrate transports located in chambers 11010 of FIG. 1E may not include adjustable end effector 350 such as when only a single size substrate is processed in the respective process module 11030SA-11030SC.

Figure 18:
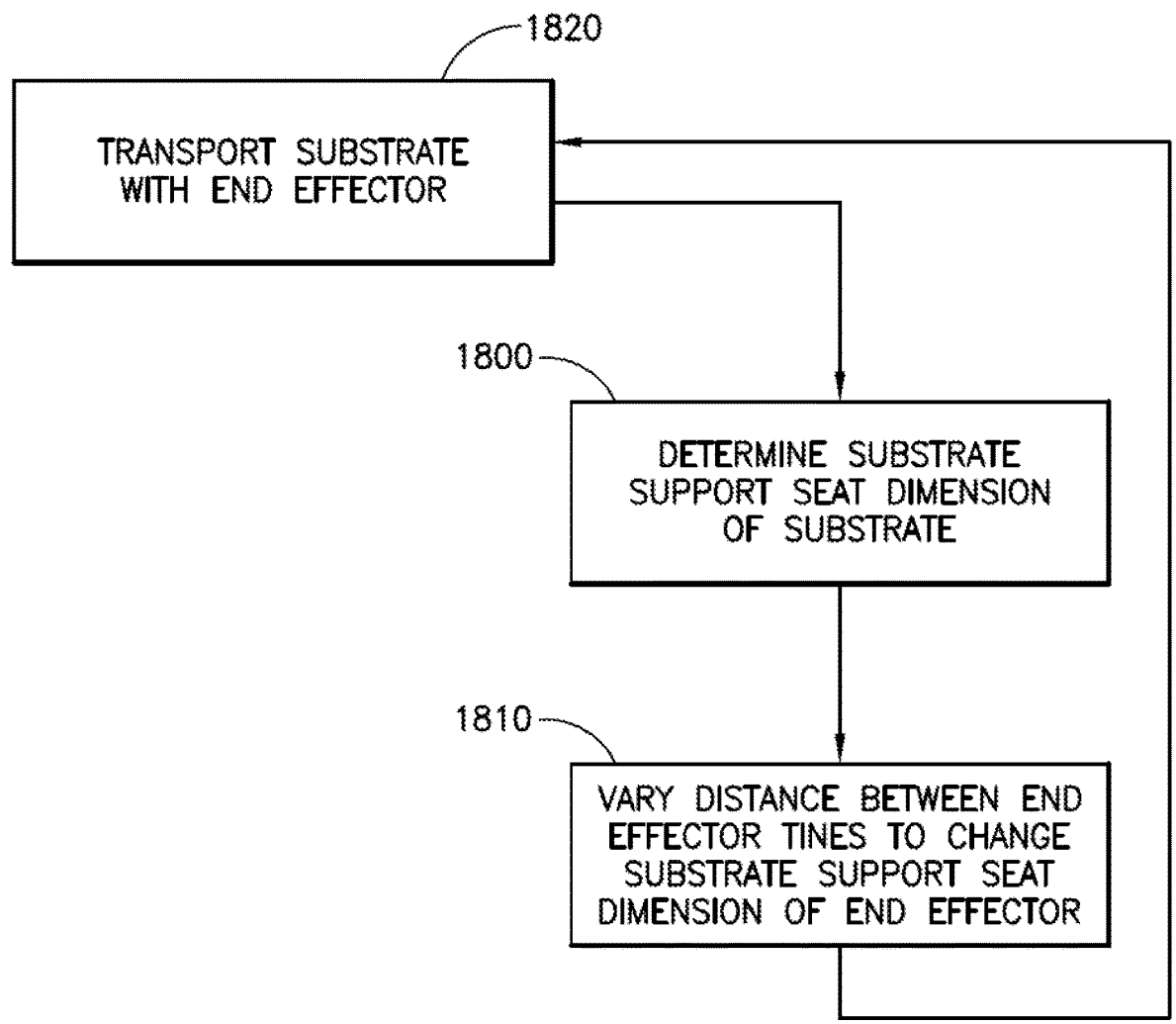
FIG. 18 is a flow diagram in accordance with aspects of the disclosed embodiment.

In one aspect, referring to substrate transport apparatus 11013 for exemplary purposes and FIG. 18, the controller 11091 effects movement of the transport apparatus 11013 to for example substrate holding station 11050S2 where the substrates at substrate holding station 11050S2 are mapped and the substrate support seat, dimension span of the substrates are determined on the fly (FIG. 18, Block 1800) as described above. The tines 350T1, 350T2 of the end effector 350 are adjusted on the fly (FIG. 18, Block 1810) as described above. A substrate S2 is picked from substrate holding station 11050S2 and is transported (FIG. 18, Block 1820) to, for example, a predetermined one of the load lock/transfer chamber 11010. In one aspect, after placement, of the substrate S2, the controller effects movement of the transport apparatus 11013 to for example substrate holding station 11050S1 where the substrates at substrate holding station 11050S1 are mapped and the substrate support, seat dimension span of the substrates are determined on the fly (FIG. 18, Block 1800) as described above. The tines 350T1, 350T2 of the end effector 350 are adjusted on the fly (FIG. 18, Block 1810) as described above. A substrate S1 is picked from substrate holding station 11050S1 and is transported (FIG. 18, Block 1820) to, for example, a predetermined one of the load lock/transfer chamber 11010. In one aspect, after placement of the substrate S1, the controller effects movement of the transport apparatus 11013 to for example substrate holding station 11050S3 where the substrates at substrate holding station 11050S3 are mapped and the substrate support seat dimension span of the substrates are determined on the fly (FIG. 18, Block 1800) as described above. The tines 350T1, 350T2 of the end effector 350 are adjusted on the fly (FIG. 18, Block 1810) as described above. A substrate S3 is picked from substrate holding station 11050S3 and is transported (FIG. 18, Block 1820) to, for example, a predetermined one of the load lock/transfer chamber 11010.

In one aspect, referring to substrate transport apparatus 11013 for exemplary purposes and FIG. 19, the controller 11091 effects movement of the transport apparatus 11013 to for example substrate holding station 11050S2 to position the common end effector 350 at the substrate holding station 11050S2, which is configured accept/hold a first type of substrate (FIG. 19, Block 1900). As described above, the substrates at substrate holding station 11050S2 are mapped and the substrate support seat dimension span of the substrates are determined on the fly. The tines 350T1, 350T2 of the end effector 350 are adjusted on the fly as described above so that a substrate S2 is picked from substrate holding station 11050S2 with the common end effector 350 (FIG. 19, Block 1910) and is transported to and placed at, for example, a substrate holding station configured to accept the first type of substrate, such as a predetermined one of the load lock/transfer chamber 11010. In one aspect, after placement of the substrate S2, the controller effects movement of the transport apparatus 11013 to for example substrate holding station 11050S1 to position the common end effector 350 at the substrate holding station 11050S1 that is configured to accept/hold a second type of substrate (FIG. 19, Block 1930). Here the substrates at substrate holding station 11050S1 are mapped and the substrate support seat dimension span of the substrates are determined on the fly as described above. The tines 350T1, 350T2 of the end effector 350 are adjusted on the fly as described above. A substrate S1 is picked from substrate holding station 11050S1 with the common end effector 350 and is transported to (FIG. 19, Block 1940) and placed at, for example, a substrate holding station configured to accept the second type of substrate (FIG. 19, Block 1950), such as a predetermined one of the load lock/transfer chamber 11010. In one aspect, after placement of the substrate S1, the controller effects movement of the transport apparatus 11013 to for example substrate holding station 11050S3 to position the common end effector at the substrate holding station 11050S3 that, is configured to accept/hold a third type of substrate (FIG. 19, Block 1960). Here the substrates at substrate holding station 11050S3 are mapped and the substrate support seat dimension span of the substrates are determined on the fly as described above. The tines 350T1, 350T2 of the end effector 350 are adjusted on the fly as described above. A substrate S3 is picked from substrate holding station 11050S3 with the common end effector 350 and is transported to (FIG. 19, Block 1970) and placed at, for example, a substrate holding station configured to accept the third type of substrate (FIG. 19, Block 1980), such as a predetermined one of the load lock/transfer chamber 11010.

As may be realized, the different sized substrates S1-S3 may be picked in any suitable order for transport to and from the process modules 11030. In one aspect, where a substrate holding station (such as a substrate cassette disposed on load port 11050) has previously been mapped such that the predetermined characteristics of the substrates at that substrate holding station have been determined by the controller 11091, re-mapping of the substrate holding station may be omitted.

In one aspect, the substrate transport apparatus 11014 picks different substrates S1-S3 from a common substrate holding station, such as load lock 11010 in FIG. 1F, the tines 350T1, 350T2 of end effector 350 of transport apparatus 11014 are adjusted based on the substrate data previously obtained and recorded in controller 11091 from transporting the substrates S1-S3 with the transport apparatus 11013. In one aspect, the previously obtained substrate data may be confirmed with transport apparatus 11014 when picking substrates S1-S3 from substrate holding station 11010 so that further adjustment may be made to the tines 350T1, 350T2 of transport apparatus 11014 if necessary. In still other aspects, the substrate data (e.g. the predetermined characteristics including size, bow and warp) may be determined for each pick made by each transport apparatus 11013, 11014.

In accordance with one or more aspects of the disclosed embodiment, a substrate processing apparatus includes:

a frame; and at least one substrate transport arm connected to the frame, the at least, one substrate transport arm having at least one end effector, each end effector having a base portion configured for coupling with a respective substrate transport arm, a first and second substrate support tines mounted to and dependent from the base portion where at least one of the first and second substrate support tines is movable relative to the base portion, each of the first and second substrate support tines having respective substrate contacts configured to contact and support a substrate held by the end effector between the respective contacts of the first and second substrate support tines at a substrate support seat dimension span between the substrate contacts of the first and second substrate support tines, and an end effector drive section configured to vary a distance between the first and second substrate support tines relative to each other on the fly and change the substrate support seat dimension span between the substrate contacts of the first and second substrate support tines from a first substrate support seat dimension span to a different second substrate support seat, dimension span.

In accordance with one or more aspects of the disclosed embodiment the substrate processing apparatus further includes at least one substrate sensor disposed on the at least one substrate transport arm, the at least one substrate sensor being configured to effect a determination of the substrate support seat dimension span on the fly.

In accordance with one or more aspects of the disclosed embodiment the at least one substrate sensor is mounted to each of the first and second substrate support tines.

In accordance with one or more aspects of the disclosed embodiment the substrate processing apparatus further includes at least one substrate sensor wherein the at least one substrate sensor includes a camera mounted to the base portion and configured to image one or more substrates at a substrate holding station.

In accordance with one or more aspects of the disclosed embodiment the at least one substrate sensor is configured to effect determination of one or more substrate characteristics for each substrate at the substrate holding station.

In accordance with one or more aspects of the disclosed embodiment the at least one substrate sensor is configured to effect the determination of the substrate support seat dimension span during a mapping of at least one substrate at a substrate holding station and prior to a pick motion of the at least one substrate transport arm.

In accordance with one or more aspects of the disclosed embodiment the substrate contacts of the first and second substrate support tines comprise vacuum backside contacts.

In accordance with one or more aspects of the disclosed embodiment the substrate contacts of the first and second substrate support tines comprise passive edge contacts.

In accordance with one or more aspects of the disclosed embodiment the substrate contacts of the first and second substrate support tines comprise passive backside contacts.

In accordance with one or more aspects of the disclosed embodiment the substrate processing apparatus further comprises a third and fourth substrate support tines having a different predetermined characteristic than the first and second substrate support tines, wherein the first and second substrate support tines are removably coupled to the base portion so as to be interchangeable with the third and fourth substrate support tines.

In accordance with one or more aspects of the disclosed embodiment the predetermined characteristics comprise different substrate contacts.

In accordance with one or more aspects of the disclosed embodiment the first and second substrate support tines are pivotally mounted to the base portion.

In accordance with one or more aspects of the disclosed embodiment the end effector drive section includes a linear slide movably coupling at least one of the first and second substrate support tines to the base portion.

In accordance with one or more aspects of the disclosed embodiment the end effector drive section includes a frog leg drive linkage coupled to the linear slide to effect movement, of the at least, one of the first and second substrate support tines.

In accordance with one or more aspects of the disclosed embodiment the end effector drive section includes at least one drive link coupled to the linear slide to effect movement of the at least one of the first and second substrate support tines.

In accordance with one or more aspects of the disclosed embodiment the end effector drive section includes a ball screw drive coupled to the linear slide to effect movement of the at least one of the first and second substrate support tines.

In accordance with one or more aspects of the disclosed embodiment the substrate processing apparatus further includes at least one stop member positioned on the base portion to limit movement of the at least one of the first and second substrate support tines.

In accordance with one or more aspects of the disclosed embodiment the substrate processing apparatus further includes a controller connected to the at least one substrate transport arm, the controller being configured to effect one or more of a substrate transport arm pick move, adjustment of the substrate support seat dimension span to pick a substrate with a nominal dimension greater than a predetermined substrate dimension, and adjustment of the substrate support seat dimension span to pick a substrate with a nominal dimension less than a predetermined substrate dimension.

In accordance with one or more aspects of the disclosed embodiment the substrate processing apparatus further includes a controller connected to the at least one substrate transport arm and configured to effect movement of the at least one of the first and second substrate support tines and varying the substrate support seat dimension span.

In accordance with one or more aspects of the disclosed embodiment the end effector drive section includes an encoder configured to determine a location of the at least one of the first and second substrate support tines relative to a predetermined location of the end effector.

In accordance with one or more aspects of the disclosed embodiment the end effector drive section includes one or more flags configured to determine a location of the at least one of the first and second substrate support, tines relative to a predetermined location of the end effector.

In accordance with one or more aspects of the disclosed embodiment the substrate processing apparatus further includes at least one substrate detection sensor and a controller connected to the at least one substrate detection sensor, the controller being configured to iteratively move the at least one of the first and second substrate support tines relative to another of the first and second substrate support tines in response to a null substrate detection signal from the at least one substrate detection sensor during a pick motion.

In accordance with one or more aspects of the disclosed embodiment the distance between the first and second substrate support tines relative to each other is varied to change the substrate support seat dimension span so that the substrate support seat dimension span ranges between an minimum substrate support seat dimension span and a maximum substrate support seat dimension span, and so that the at least one end effector effects picking of substrates with diameters in a range between 100 mm and 450 mm and of bowed or warped substrates with the first and second substrate support tines being common for each pick.

In accordance with one or more aspects of the disclosed embodiment a substrate processing apparatus includes:

a frame; and at least one substrate transport arm connected to the frame, the at least, one substrate transport arm having at least one end effector, each end effector having a base portion configured for coupling with the respective substrate transport arm, a grip portion having first and second substrate support tines mounted to and dependent from the base portion where at least one of the first and second substrate support tines is movable relative to the base portion, each of the first and second substrate support tines having respective substrate contacts configured to support a substrate held by the end effector between the respective substrate contacts of the first and second substrate support tines at a substrate support seat dimension span between the first, and second substrate support tines relative to each other, the grip portion having more than one different substrate support seat dimension span common to the first and second substrate support tines, at least one substrate sensor connected to the base portion and configured to effect determination of the substrate support seat dimension span between the first and second substrate support tines relative to each other from the more than one different substrate support seat dimension span of the grip portion, wherein determination of the substrate support seat dimension span is effected in but one motion of the at least one substrate transport arm to pick and grip a substrate at a substrate holding station, and an end effector drive section configured to vary a distance between the first and second substrate support tines relative to each other on the fly based on the determined substrate support seat dimension span.

In accordance with one or more aspects of the disclosed embodiment the determination of the substrate support seat dimension span is effected by and coincident with a transport arm motion to pick a substrate from a substrate holding station.

In accordance with one or more aspects of the disclosed embodiment the at least one substrate sensor is mounted to each of the first and second substrate support tines.

In accordance with one or more aspects of the disclosed embodiment the at least one substrate sensor includes a camera mounted to the base portion and configured to image one or more substrates at a substrate holding station.

In accordance with one or more aspects of the disclosed embodiment the at least one substrate sensor is configured to effect determination of one or more substrate characteristics for each substrate at the substrate holding station.

In accordance with one or more aspects of the disclosed embodiment the at least one substrate sensor is configured to effect the determination of the substrate support seat dimension span during a mapping of at least one substrate at a substrate holding station and prior to a pick motion of the at least one substrate transport arm.

In accordance with one or more aspects of the disclosed embodiment the substrate contacts of the first and second substrate support tines comprise vacuum backside contacts.

In accordance with one or more aspects of the disclosed embodiment the substrate contacts of the first and second substrate support tines comprise passive edge contacts.

In accordance with one or more aspects of the disclosed embodiment the substrate contacts of the first and second substrate support tines comprise passive backside contacts.

In accordance with one or more aspects of the disclosed embodiment the substrate processing apparatus further includes a third and fourth substrate support tines having a different predetermined characteristic than the first and second substrate support tines, wherein the first and second substrate support tines are removably coupled to the base portion so as to be interchangeable with the third and fourth substrate support tines.

In accordance with one or more aspects of the disclosed embodiment the predetermined characteristics comprise different substrate contacts.

In accordance with one or more aspects of the disclosed embodiment the first and second substrate support tines are pivotally mounted to the base portion.

In accordance with one or more aspects of the disclosed embodiment the end effector drive section includes a linear slide movably coupling at least one of the first and second substrate support tines to the base portion.

In accordance with one or more aspects of the disclosed embodiment the end effector drive section includes a frog leg drive linkage coupled to the linear slide to effect movement of the at least one of the first and second substrate support tines.

In accordance with one or more aspects of the disclosed embodiment the end effector drive section includes at least one drive link coupled to the linear slide to effect movement of the at least one of the first and second substrate support tines.

In accordance with one or more aspects of the disclosed embodiment the end effector drive section includes a ball screw drive coupled to the linear slide to effect movement of the at least one of the first and second substrate support tines.

In accordance with one or more aspects of the disclosed embodiment the substrate processing apparatus further includes at least one stop member positioned on the base portion to limit movement of the at least one of the first and second substrate support tines.

In accordance with one or more aspects of the disclosed embodiment the substrate processing apparatus further includes a controller connected to the at least one substrate transport arm, the controller being configured to effect one or more of a substrate transport arm pick move, adjustment of the substrate support seat dimension span between the first and second substrate support tines relative to each other to pick a substrate with a nominal dimension greater than a predetermined substrate dimension, and adjustment of the substrate support seat dimension span between the first and second substrate support, tines relative to each other to pick a substrate with a nominal dimension less than a predetermined substrate dimension.

In accordance with one or more aspects of the disclosed embodiment the substrate processing apparatus further includes a controller connected to the at least one substrate transport arm and configured to effect movement of the at least one of the first and second substrate support tines relative to each other.

In accordance with one or more aspects of the disclosed embodiment the end effector drive section includes an encoder configured to determine a location of the at least one of the first and second substrate support tines relative to a predetermined location of the end effector.

In accordance with one or more aspects of the disclosed embodiment the end effector drive section includes one or more flags configured to determine a location of the at least one of the first and second substrate support tines relative to a predetermined location of the end effector.

In accordance with one or more aspects of the disclosed embodiment the substrate processing apparatus further includes at least one substrate detection sensor and a controller connected to the at least one substrate detection sensor, the controller being configured to iteratively move the at least one of the first and second substrate support tines relative to another of the first and second substrate support tines in response to a null substrate detection signal from the at least one substrate detection sensor during a pick motion.

In accordance with one or more aspects of the disclosed embodiment the substrate processing apparatus further includes a controller configured to calculate and determine the substrate support seat dimension span based on signals from the at least one substrate sensor and effect adjustment of the first and second substrate support, tines so that a distance between the respective substrate contacts of the first and second substrate support tines is substantially the same as the determined substrate support, seat dimension span.

In accordance with one or more aspects of the disclosed embodiment a distance between the first and second substrate support tines relative to each other is varied to change the substrate support seat dimension span so that the substrate support seat dimension span ranges between an minimum substrate support seat dimension span and a maximum substrate support seat dimension span, and so that the at least one end effector effects picking of substrates with diameters in a range between 100 mm and 450 mm and of bowed or warped substrates with the first and second substrate support tines being common for each pick.

In accordance with one or more aspects of the disclosed embodiment a substrate processing method includes:

transporting, with a common end effector of a substrate transport arm having a variable grip arrangement, a substrate having a first size; and transporting, with the common end effector, a substrate having a second size where the first size is different than the second size.

In accordance with one or more aspects of the disclosed embodiment the first size is a nominal substrate dimension that is equal to or greater than a predetermined substrate dimension and the variable grip arrangement of the common end effector is configured to pick and transport substrates having the nominal substrate dimension and further configured to pick and place substrates of the nominal substrate dimension from and to substrate holding stations configured for substrates of a first size with the common end effector.

In accordance with one or more aspects of the disclosed embodiment the second size is another nominal substrate dimension that is less than the predetermined substrate dimension, the method further comprising placing with the common end effector substrates of the second size to a different substrate holding stations configured to accept substrates of the other nominal substrate dimension and not accept substrates of the first size.

In accordance with one or more aspects of the disclosed embodiment the method further includes varying a distance between a first and second substrate support tines of the variable grip arrangement on the fly and change a substrate support seat dimension span between substrate contacts of the first and second substrate support tines from a first substrate support seat dimension span to a different second substrate support seat dimension span.

In accordance with one or more aspects of the disclosed embodiment the method further includes determining a substrate support seat dimension span of a substrate during mapping of one or more substrates at a substrate holding station prior to picking the one or more substrates from the substrate holding station.

In accordance with one or more aspects of the disclosed embodiment the method further includes determining a substrate support seat dimension span of a substrate coincident with a motion of the substrate transport arm to pick and grip a substrate from a substrate holding station.

In accordance with one or more aspects of the disclosed embodiment the determination of the substrate support seat dimension span is effected at least in part by the motion of the substrate transport arm to pick and grip a substrate from a substrate holding station.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate processing apparatus comprising:
a frame; and
at least one substrate transport arm connected to the frame, the at least one substrate transport arm having at least one end effector, each end effector having
a base portion configured for coupling with a respective substrate transport arm,
a first and second substrate support tines mounted to and dependent from the base portion where at least one of the first and second substrate support tines is movable relative to the base portion, each of the first and second substrate support tines having respective substrate contacts configured to contact and support a substrate held by the end effector between the respective substrate contacts of the first and second substrate support tines at a substrate support seat dimension span between the respective substrate contacts of the first and second substrate support tines, and an end effector drive section configured to vary a distance between the first and second substrate support tines relative to each other on the fly and change the substrate support seat dimension span between the respective substrate contacts of the first and second substrate support tines from a first substrate support seat dimension span to a different second substrate support seat dimension span.

2. The substrate processing apparatus of claim 1, further comprising at least one substrate sensor disposed on the at least one substrate transport arm, the at least one substrate sensor being configured to effect a determination of the substrate support seat dimension span on the fly.

3. The substrate processing apparatus of claim 2, wherein the at least one substrate sensor is mounted to each of the first and second substrate support tines.

4. The substrate processing apparatus of claim 1, further comprising at least one substrate sensor wherein the at least one substrate sensor includes a camera mounted to the base portion and configured to image one or more substrates at a substrate holding station.

5. The substrate processing apparatus of claim 4, wherein the at least one substrate sensor is configured to effect a determination of one or more substrate characteristics for each substrate at the substrate holding station.

6. The substrate processing apparatus of claim 5, wherein the at least one substrate sensor is configured to effect a determination of the substrate support seat dimension span during a mapping of at least one substrate at the substrate holding station and prior to a pick motion of the at least one substrate transport arm.

7. The substrate processing apparatus of claim 1, further comprising a third and fourth substrate support tines having a different predetermined characteristic than the first and second substrate support tines, wherein the first and second substrate support tines are removably coupled to the base portion so as to be interchangeable with the third and fourth substrate support tines.

8. The substrate processing apparatus of claim 7, wherein the different predetermined characteristics comprise different substrate contacts.

9. The substrate processing apparatus of claim 1, wherein the first and second substrate support tines are pivotally mounted to the base portion.

10. The substrate processing apparatus of claim 1, wherein the end effector drive section includes a linear slide movably coupling at least one of the first and second substrate support tines to the base section.

11. The substrate processing apparatus of claim 10, wherein the end effector drive section further includes at least one drive link coupled to the linear slide to effect movement of the at least one of the first and second substrate support tines.

12. The substrate processing apparatus of claim 10, wherein the end effector drive section further includes a ball screw drive coupled to the linear slide to effect movement of the at least one of the first and second substrate support tines.

13. The substrate processing apparatus of claim 1, further comprising a controller connected to the at least one substrate transport arm, the controller being configured to effect one or more of a substrate transport arm pick move,
adjustment of the substrate support seat dimension span to pick a substrate with a nominal dimension greater than a predetermined substrate dimension, and
adjustment of the substrate support seat dimension span to pick a substrate with a nominal dimension less than a predetermined substrate dimension.

14. The substrate processing apparatus of claim 1, further comprising a controller connected to the at least one substrate transport arm and configured to effect movement of the at least one of the first and second substrate support tines and varying the substrate support seat dimension span.

15. The substrate processing apparatus of claim 1, wherein the end effector drive section includes an encoder configured to determine a location of the at least one of the first and second substrate support tines relative to a predetermined location of the end effector.

16. The substrate processing apparatus of claim 1, wherein the end effector drive section includes one or more flags configured to determine a location of the at least one of the first and second substrate support tines relative to a predetermined location of the end effector.

17. The substrate processing apparatus of claim 1, further comprising at least one substrate detection sensor and a controller connected to the at least one substrate detection sensor, the controller being configured to iteratively move the at least one of the first and second substrate support tines relative to another of the first and second substrate support tines in response to a null substrate detection signal from the at least one substrate detection sensor during a pick motion.

18. The substrate processing apparatus of claim 1, wherein the distance between the first and second substrate support tines relative to each other is varied to change the substrate support seat dimension span so that the substrate support seat dimension span ranges between a minimum substrate support seat dimension span and a maximum substrate support seat dimension span, and so that the at least one end effector effects picking of substrates with diameters in a range between 100 mm and 450 mm and of bowed or warped substrates with the first and second substrate support tines being common for each pick.

19. A substrate processing apparatus comprising:
a frame; and
at least one substrate transport arm connected to the frame, the at least one substrate transport arm having at least one end effector, each end effector having
a base portion configured for coupling with the respective substrate transport arm,
a grip portion having first and second substrate support tines mounted to and dependent from the base portion where at least one of the first and second substrate support tines is movable relative to the base portion, each of the first and second substrate support tines having respective substrate contacts configured to support a substrate held by the end effector between the respective substrate contacts of the first and second substrate support tines at a substrate support seat dimension span between the first and second substrate support tines relative to each other, the grip portion having more than one different substrate support seat dimension span common to the first and second substrate support tines,
at least one substrate sensor connected to the base portion and configured to effect determination of the substrate support seat dimension span between the first and second substrate support tines relative to each other from the more than one different substrate support seat dimension span of the grip portion, wherein determination of the substrate support seat dimension span is effected in but one motion of the at least one substrate transport arm to pick and grip a substrate at a substrate holding station, and an end effector drive section configured to vary a distance between the first and second substrate support tines relative to each other on the fly based on the determined substrate support seat dimension span.

20. The substrate processing apparatus of claim 19, wherein the determination of the substrate support seat dimension span is effected by and coincident with a transport arm motion to pick a substrate from a substrate holding station.

21. The substrate processing apparatus of claim 19, wherein the at least one substrate sensor is mounted to each of the first and second substrate support tines.

22. The substrate processing apparatus of claim 19, wherein the at least one substrate sensor includes a camera mounted to the base portion and configured to image one or more substrates at a substrate holding station.

23. The substrate processing apparatus of claim 19, wherein the at least one substrate sensor is configured to effect a determination of one or more substrate characteristics for each substrate at the substrate holding station.

24. The substrate processing apparatus of claim 23, wherein the at least one substrate sensor is configured to effect the determination of the substrate support seat dimension span during a mapping of at least one substrate at a substrate holding station and prior to a pick motion of the at least one substrate transport arm.

25. The substrate processing apparatus of claim 19, wherein the respective substrate contacts of the first and second substrate support tines comprise at least one of a vacuum backside contact, a passive edge contact, and a passive backside contact.

26. The substrate processing apparatus of claim 19, further comprising a third and fourth substrate support tines having a different predetermined characteristic than the first and second substrate support tines, wherein the first and second substrate support tines are removably coupled to the base portion so as to be interchangeable with the third and fourth substrate support tines.

27. The substrate processing apparatus of claim 26, wherein the different predetermined characteristics comprise different substrate contacts.

28. The substrate processing apparatus of claim 19, wherein the first and second substrate support tines are pivotally mounted to the base portion.

29. The substrate processing apparatus of claim 19, wherein the end effector drive section includes a linear slide movably coupling at least one of the first and second substrate support tines to the base portion.

30. The substrate processing apparatus of claim 19, further comprising a controller connected to the at least one substrate transport arm, the controller being configured to effect one or more of a substrate transport arm pick move, adjustment of the substrate support seat dimension span between the first and second substrate support tines relative to each other to pick a substrate with a nominal dimension greater than a predetermined substrate dimension, and adjustment of the substrate support seat dimension span between the first and second substrate support tines relative to each other to pick a substrate with a nominal dimension less than a predetermined substrate dimension.

31. The substrate processing apparatus of claim 19, wherein the end effector drive section includes one or more flags configured to determine a location of the at least one of the first and second substrate support tines relative to a predetermined location of the end effector.

32. The substrate processing apparatus of claim 19, further comprising at least one substrate detection sensor and a controller connected to the at least one substrate detection sensor, the controller being configured to iteratively move the at least one of the first and second substrate support tines relative to another of the first and second substrate support tines in response to a null substrate detection signal from the at least one substrate detection sensor during a pick motion.

33. The substrate processing apparatus of claim 19, further comprising a controller configured to calculate and determine the substrate support seat dimension span based on signals from the at least one substrate sensor and effect adjustment of the first and second substrate support tines so that a distance between the respective substrate contacts of the first and second substrate support tines is substantially the same as the determined substrate support seat dimension span.

34. The substrate processing apparatus of claim 19, wherein a distance between the first and second substrate support tines relative to each other is varied to change the substrate support seat dimension span so that the substrate support seat dimension span ranges between a minimum substrate support seat dimension span and a maximum substrate support seat dimension span, and so that the at least one end effector effects picking of substrates with diameters in a range between 100 mm and 450 mm and of bowed or warped substrates with the first and second substrate support tines being common for each pick.

35. A method for substrate processing comprising:

transporting, with a common end effector of a substrate transport arm having a variable grip arrangement, a substrate having a first size;

transporting, with the common end effector, a substrate having a second size where the first size is different than the second size; and varying a distance between substrate support contact seating surfaces of the variable grip arrangement on the fly and changing a substrate support seat dimension span between the substrate support contact seating surfaces from a first substrate support seat dimension span to a different second substrate support seat dimension span.

36. The method of claim 35, wherein the first size is a nominal substrate dimension that is equal to or greater than a predetermined substrate dimension and the variable grip arrangement of the common end effector is configured to pick and transport substrates having the nominal substrate dimension and further configured to pick and place substrates of the nominal substrate dimension from and to substrate holding stations configured for substrates of a first size with the common end effector.

37. The method of claim 36, wherein the second size is another nominal substrate dimension that is less than the predetermined substrate dimension, the method further comprising placing with the common end effector substrates of the second size to a different substrate holding stations configured to accept substrates of the other nominal substrate dimension and not accept substrates of the first size.

38. The method of claim 35, wherein varying a distance between substrate support contact seating surfaces of the variable grip arrangement comprises varying a distance between a first and second substrate support tines of the variable grip arrangement on the fly and changing the substrate support seat dimension span between the substrate support contact seating surfaces of the first and second substrate support tines from the first substrate support seat dimension span to the different second substrate support seat dimension span.

39. The method of claim 35, further comprising determining one or more of the first substrate support seat dimension span of a substrate and the different second substrate support seat dimension span of another substrate during mapping of one or more substrates at a substrate holding station prior to picking the one or more substrates from the substrate holding station.

40. The method of claim 35, further comprising determining one or more of the first substrate support seat dimension span of a substrate and the different second substrate support seat dimension span of another substrate coincident with a motion of the substrate transport arm to pick and grip the substrate or the another substrate from a respective substrate holding station.

41. The method of claim 40, wherein the determination of the substrate support seat dimension span is effected at least in part by the motion of the substrate transport arm to pick and grip a substrate from a substrate holding station.

\* \* \* \* \*